(12) United States Patent
Kida

(10) Patent No.: US 8,913,224 B2
(45) Date of Patent: Dec. 16, 2014

(54) EXPOSURE APPARATUS, EXPOSURE METHOD, AND DEVICE PRODUCING METHOD

(75) Inventor: Yoshiki Kida, Kita-ku (JP)

(73) Assignee: Nixon Corporation, Tokyo (JP)

(*) Notice: Subject to any disclaimer, the term of this patent is extended or adjusted under 35 U.S.C. 154(b) by 753 days.

(21) Appl. No.: 13/137,692

(22) Filed: Sep. 2, 2011

(65) Prior Publication Data

US 2012/0026475 A1 Feb. 2, 2012

Related U.S. Application Data

(63) Continuation of application No. 11/660,921, filed as application No. PCT/JP2005/022634 on Dec. 9, 2005, now Pat. No. 8,035,799.

(30) Foreign Application Priority Data

Dec. 9, 2004 (JP) .................................. 2004-356535
Dec. 5, 2005 (JP) .................................. 2005-350685

(51) Int. Cl.
*G03F 7/20* (2006.01)

(52) U.S. Cl.
CPC .......... *G03F 7/70925* (2013.01); *G03F 7/2041* (2013.01); *G03F 7/70916* (2013.01); *G03F 7/70975* (2013.01); *G03F 7/7085* (2013.01); *G03F 7/70341* (2013.01)
USPC .............................................. 355/53; 355/30

(58) Field of Classification Search
CPC ............ G03F 7/70341; G03F 7/70916; G03F 7/7085; G03F 7/70925
USPC ........................................................ 355/53, 30
See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| RE32,795 | E | 12/1988 | Matsuura et al. |
| 5,493,403 | A | 2/1996 | Nishi |
| 5,528,118 | A | 6/1996 | Lee |
| 5,610,683 | A | 3/1997 | Takahashi |
| 5,623,853 | A | 4/1997 | Novak et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Chinese Patent Office, Chinese Office Action for Chinese Patent Application No. 2005800355949 (with partial English translation), dated May 9, 2008, pp. 1-4 (pp. 1-2 for partial translation).

(Continued)

*Primary Examiner* — Peter B Kim
(74) *Attorney, Agent, or Firm* — Oliff PLC

(57) ABSTRACT

An exposure apparatus EX is provided with a measuring unit 60 which measures at least one of property and components of a liquid LQ in a state that a liquid immersion area LR is formed on an object different from a substrate P to be exposed. There is provided an exposure apparatus which can accurately perform exposure process and measurement process through the liquid by judging the state of the liquid in advance and by performing a procedure as appropriate.

23 Claims, 12 Drawing Sheets

(56) References Cited

U.S. PATENT DOCUMENTS

| | | |
|---|---|---|
| 5,646,413 A | 7/1997 | Nishi |
| 5,696,441 A | 12/1997 | Mak et al. |
| 5,715,039 A | 2/1998 | Fukuda et al. |
| 5,825,043 A | 10/1998 | Suwa |
| 5,874,820 A | 2/1999 | Lee |
| 6,195,154 B1 | 2/2001 | Imai |
| 6,208,407 B1 | 3/2001 | Loopstra |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,721,039 B2 | 4/2004 | Ozawa |
| 6,778,257 B2 | 8/2004 | Bleeker et al. |
| 7,317,504 B2 | 1/2008 | De smit et al. |
| 7,505,111 B2 | 3/2009 | Hirukawa et al. |
| 2002/0041377 A1 | 4/2002 | Hagiwara et al. |
| 2002/0061469 A1 | 5/2002 | Tanaka |
| 2004/0165159 A1 | 8/2004 | Lof et al. |
| 2004/0207824 A1 | 10/2004 | Lof et al. |
| 2004/0238005 A1 | 12/2004 | Takayama |
| 2005/0074704 A1 | 4/2005 | Endo et al. |
| 2005/0078286 A1 | 4/2005 | Dierichs et al. |
| 2005/0179877 A1 | 8/2005 | Mulkens et al. |
| 2005/0219490 A1 | 10/2005 | Owa |
| 2005/0225734 A1 | 10/2005 | De Smit et al. |
| 2005/0264774 A1 | 12/2005 | Mizutani et al. |
| 2006/0126043 A1 | 6/2006 | Mizutani et al. |
| 2006/0231206 A1 | 10/2006 | Nagasaka et al. |
| 2007/0009841 A1 | 1/2007 | Endo et al. |
| 2007/0242247 A1 | 10/2007 | Shiraishi |
| 2007/0291239 A1 | 12/2007 | Shiraishi |
| 2008/0212043 A1 | 9/2008 | Nagasaka |
| 2008/0239260 A1 | 10/2008 | Shiraishi |

FOREIGN PATENT DOCUMENTS

| | | |
|---|---|---|
| EP | 1 041 357 A1 | 10/2000 |
| EP | 1 420 298 A2 | 5/2004 |
| EP | 1 482 372 A1 | 12/2004 |
| EP | 1 486 827 A2 | 12/2004 |
| EP | 1 510 872 A2 | 3/2005 |
| EP | 1 522 894 A2 | 4/2005 |
| EP | 1 571 699 A1 | 9/2005 |
| EP | 1 571 701 A1 | 9/2005 |
| EP | 1 628 330 A1 | 2/2006 |
| EP | 1 783 821 A1 | 5/2007 |
| EP | 1 808 884 A1 | 7/2007 |
| JP | A 57-117238 | 7/1982 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-65603 | 3/1992 |
| JP | A 4-305915 | 10/1992 |
| JP | A 4-305917 | 10/1992 |
| JP | A 5-62877 | 3/1993 |
| JP | A 6-124873 | 5/1994 |
| JP | A 07-176468 | 7/1995 |
| JP | A 7-220990 | 8/1995 |
| JP | A-8-37149 | 2/1996 |
| JP | A-8-166475 | 6/1996 |
| JP | A 8-316125 | 11/1996 |
| JP | A-8-330224 | 12/1996 |
| JP | A-10-163099 | 6/1998 |
| JP | A-10-214783 | 8/1998 |
| JP | A 10-303114 | 11/1998 |
| JP | A 10-340846 | 12/1998 |
| JP | A 11-16816 | 1/1999 |
| JP | A 11-135400 | 5/1999 |
| JP | A 11-176727 | 7/1999 |
| JP | A 2000-58436 | 2/2000 |
| JP | A-2000-505958 | 5/2000 |
| JP | A 2001-267239 | 9/2001 |
| JP | A 2002-14005 | 1/2002 |
| JP | A-2005-79222 | 3/2005 |
| JP | A-2005-79584 | 3/2005 |
| JP | A-2005-136404 | 5/2005 |
| JP | A-2005-183693 | 7/2005 |
| JP | A 2005-209705 | 8/2005 |
| JP | A-2006-190997 | 7/2006 |
| WO | WO 99/49504 | 9/1999 |
| WO | WO 01/35168 A1 | 5/2001 |
| WO | WO 2004/019128 A2 | 3/2004 |
| WO | WO 2004/053950 A1 | 6/2004 |
| WO | WO 2004/053958 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 A2 | 10/2004 |
| WO | WO 2004/105107 A1 | 12/2004 |
| WO | WO 2004/107417 A1 | 12/2004 |
| WO | WO 2005/022615 A1 | 3/2005 |
| WO | WO 2005/029559 A1 | 3/2005 |
| WO | WO 2005/062065 A1 | 7/2005 |
| WO | WO 2006/029824 A2 | 3/2006 |

OTHER PUBLICATIONS

International Search Report for PCT/JP2005/022634 (with English translation), dated Mar. 20, 2006, pp. 1-2.
Supplementary Extended European Search Report completed Jan. 31, 2011 mailed Feb. 4, 2011 in European Application No. 05 81 4747.1.
Written Opinion mailed Sep. 20, 2005 in International Application No. PCT/JP2005/010412 (with translation).
International Search Report mailed Sep. 20, 2005 in International Application No. PCT/JP2005/010412 (with translation).
Supplementary European Search Report completed Jun. 2, 2009 in European Application No. EP 05 74 9073.2.
Foreign Office Action dated Jul. 4, 2008 issued in Chinese Application No. 2005800183590 (with translation).
Foreign Office Action dated Jul. 10, 2009 issued in Chinese Application No. 2005800183590 (with translation).
Foreign Office Action mailed Dec. 14, 2010 in Japanese Application No. 2006-514514 (with translation).
Office Action mailed Apr. 1, 2008 in U.S. Appl. No. 11/570,219.
Office Action mailed Nov. 17, 2008 in U.S. Appl. No. 11/570,219.
Office Action mailed Jun. 24, 2009 in U.S. Appl. No. 11/570,219.
Office Action mailed Mar. 3, 2010 in U.S. Appl. No. 11/570,219.
Office Action mailed Nov. 4, 2010 in U.S. Appl. No. 11/570,219.
Foreign Office Action mailed Aug. 3, 2010 in Japanese Application No. 2006-514514 (with translation).

EXPOSURE APPARATUS, EXPOSURE METHOD, AND DEVICE PRODUCING METHOD

This is a Continuation of application Ser. No. 11/660,921 filed Feb. 23, 2007, which claims the benefit of PCT Application No. PCT/JP2005/022634 filed Dec. 9, 2005, Japanese Application No. 2004/356535 filed Dec. 9, 2004, and Japanese Application No. 2005/350685 filed Dec. 5, 2005 in Japan. The disclosure of the prior applications is hereby incorporated by reference herein in its entirety.

TECHNICAL FIELD

The present invention relates to an exposure apparatus and an exposure method for exposing a substrate, and a device producing method.

BACKGROUND ART

In photolithography process, as one of the producing processes for a micro device such as a semiconductor device or a liquid crystal display device, an exposure apparatus which projects a pattern formed on a mask onto a photosensitive substrate by exposure is employed. This exposure apparatus has a mask stage supporting a mask and a substrate stage supporting a substrate, and projects a pattern of a mask to a substrate via a projection optical system while successively moving the mask stage and the substrate stage. In micro device producing, for higher integration of the device, it has been demanded to increase the fineness of the pattern to be formed on the substrate. To meet this demand, higher resolution of the exposure apparatus has been desired. As one of the means for realizing this higher resolution, a liquid immersion exposure apparatus is proposed which fills a liquid in an optical-path space between a projection optical system and a substrate and performs an exposure process through the liquid, as disclosed in the following patent document 1.

Patent document 1: Pamphlet of International Publication Pamphlet No. 99/49504

DISCLOSURE OF THE INVENTION

Problem to be Solved by the Invention

In the liquid immersion exposure apparatus, exposure process and measurement process through a liquid are performed, and if the liquid is polluted or degraded, there is a fear that the results of the exposure process and measurement process are affected. Therefore, it is important to grasp the state of the liquid and take a proper measure.

The present invention has been made taking the foregoing circumstances into consideration, and an, object thereof is to provide an exposure apparatus, an exposure method and a device producing method in which the state of the liquid (property, components and the like) can be accurately grasped.

Means for Solving the Problem

In order to solve the problem, the invention adopts the following constructions corresponding to FIG. 1 to FIG. 13 as shown in embodiments. However, parenthesized reference numerals affixed to the respective elements merely exemplify the elements by way of example, with which it is not intended to limit the respective elements.

According to a first aspect of the invention, there is provided an exposure apparatus (EX) which exposes a substrate (P) by irradiating the substrate (P) with an exposure light beam (EL) via an optical member (LS1), the exposure apparatus comprising: an object (ST1, ST2, DP, and the like) which is arranged on a light-exit side of the optical member and is different from the substrate; a liquid immersion mechanism (12, 22, and the like) which fills an optical path space (K1) between the optical member and the object (ST1, ST2, DP, and the like) with a liquid (LQ); and a measuring unit (60) which measures at least one of property and components of the liquid (LQ) in a state that a liquid immersion area (LR) is formed on the object (ST1, ST2, DP, and the like).

According to the first aspect of the invention, since the state of the liquid can be grasped without contact with the substrate to be exposed, a procedure or treatment for setting the liquid to a desired state can be taken, and exposure process and measurement process through the liquid can be accurately performed.

According to a second aspect of the invention, there is provided an exposure apparatus (EX) which exposes a substrate (P) by irradiating the substrate (P) with an exposure light beam (EL) via an optical member (LS1), the exposure apparatus comprising: a liquid immersion mechanism (1) which fills a predetermined space (K1) on a light-exit side of the optical member with a liquid (LQ); and a measuring unit (60) which measures at least one of property and components of the liquid (LQ); wherein the liquid immersion mechanism (1) has a flow channel (13, 23) in which the liquid flows, and the measuring unit (60) measures the liquid (LQ) at a first position (C1) in the flow channel (13, 23) and measures the liquid (LQ) at a second position (CQ) in the flow channel (13, 23).

According to the second aspect of the invention, since the states of the liquid at the first position in the flow channel of the liquid immersion mechanism and the liquid at the second position in the flow channel can be grasped, a procedure or treatment for setting the liquid to a desired state can be taken, and exposure process and measurement process through the liquid can be accurately performed.

According to a third aspect of the invention, there is provided an exposure method for exposing a substrate (P) through a liquid (LQ), the method comprising: a first step (SA1) of forming a liquid immersion area (LR) on an object (ST1, ST2, DP, and the like) different from the substrate (P); a second step (SA2, SA3) of inspecting a state of the liquid (LQ) in a state that the liquid immersion area (LR) is formed on the object (ST1, ST2, DP, and the like); a third step (SA15) of adjusting an exposure conditions based on a result of inspection; and a fourth step (SA7) of exposing the substrate under the adjusted exposure condition by irradiating the substrate with an exposure light beam (EL) through a liquid in the liquid immersion area (LR) formed on the substrate (P).

According to the exposure method of the third aspect of the invention, a liquid immersion area is formed in advance by using an object different from the substrate, and optimum exposure conditions including the state of the liquid can be set by grasping the state of the liquid to be used for the liquid immersion exposure. Accordingly, that exposure process and measurement process can be accurately performed.

According to a fourth aspect of the invention, there is provided an exposure method for exposing a substrate (P) by irradiating the substrate (P) with an exposure light beam (EL) through a liquid (LQ), the method comprising: flowing the liquid (LQ) to a predetermined liquid immersion area (LR) through a flow channel (13, 23); detecting a state of the liquid at a first position (C1) and a second position (C2) of the flow channel (13, 23); and forming a liquid immersion area on the substrate to expose the substrate, based on a result of detection.

According to the fourth aspect of the invention, since the states of the liquid at the first position in the flow channel toward the liquid immersion area and the liquid at the second position can be grasped, the procedure or treatment for setting the liquid to a desired state can be taken, and the exposure process and measurement process through the liquid can be accurately performed.

According to a fifth aspect of the invention, there is provided a device producing method using the exposure apparatus (EX) according to the above-described aspects. According to the fifth aspect of the invention, a device can be produced by using the exposure apparatus with which the exposure process and measurement process through a liquid can be accurately performed.

According to a sixth aspect of the invention, there is provided a device producing method, comprising: a step of exposing a substrate by the exposure method according to the above-described aspects; a step of developing the exposed substrate; and a step of processing the developed substrate. According to the sixth aspect of the invention, a device can be produced by using the exposure method with which exposure process and measurement process through a liquid can be accurately performed.

Effects of the Invention

According to the invention, exposure process and measurement process through a liquid can be accurately performed.

LEGENDS OF REFERENCE NUMERALS

1: liquid immersion mechanism, 2: base material, 3: photosensitive material, 10: liquid supply mechanism, 11: liquid supply unit, 12: supply port, 13: supply tube, 20: liquid recovery mechanism, 21: liquid recovery unit, 22: recovery port, 23: recovery tube, 60: measuring unit, 61-64: measuring instrument, 61K-61K: branched tube, 70: nozzle member, 95: upper surface, 100: predetermined area, 300: reference member, 120: functional fluid supply unit, 161: water purifying unit, 162: ultrapure water-producing unit, 173: degassing unit, 173: filter, 400, 500, 600: sensor, AR: projection area, C1: first position, C2: second position, CONT: control unit, DP: dummy substrate, EL: exposure light beam, EX: exposure apparatus, INF: reporting unit (informing unit), K1: optical path space, LK: functional fluid, LR: liquid immersion area, LQ: liquid, MRY: memory, P: substrate, PL: projection optical system, ST1: substrate stage, ST2: measuring stage

BEST MODE FOR CARRYING OUT THE INVENTION

Hereinafter, embodiments of the invention will be described with reference to the drawings. However, the invention is not limited to the embodiments.

First Embodiment

Figure 1:
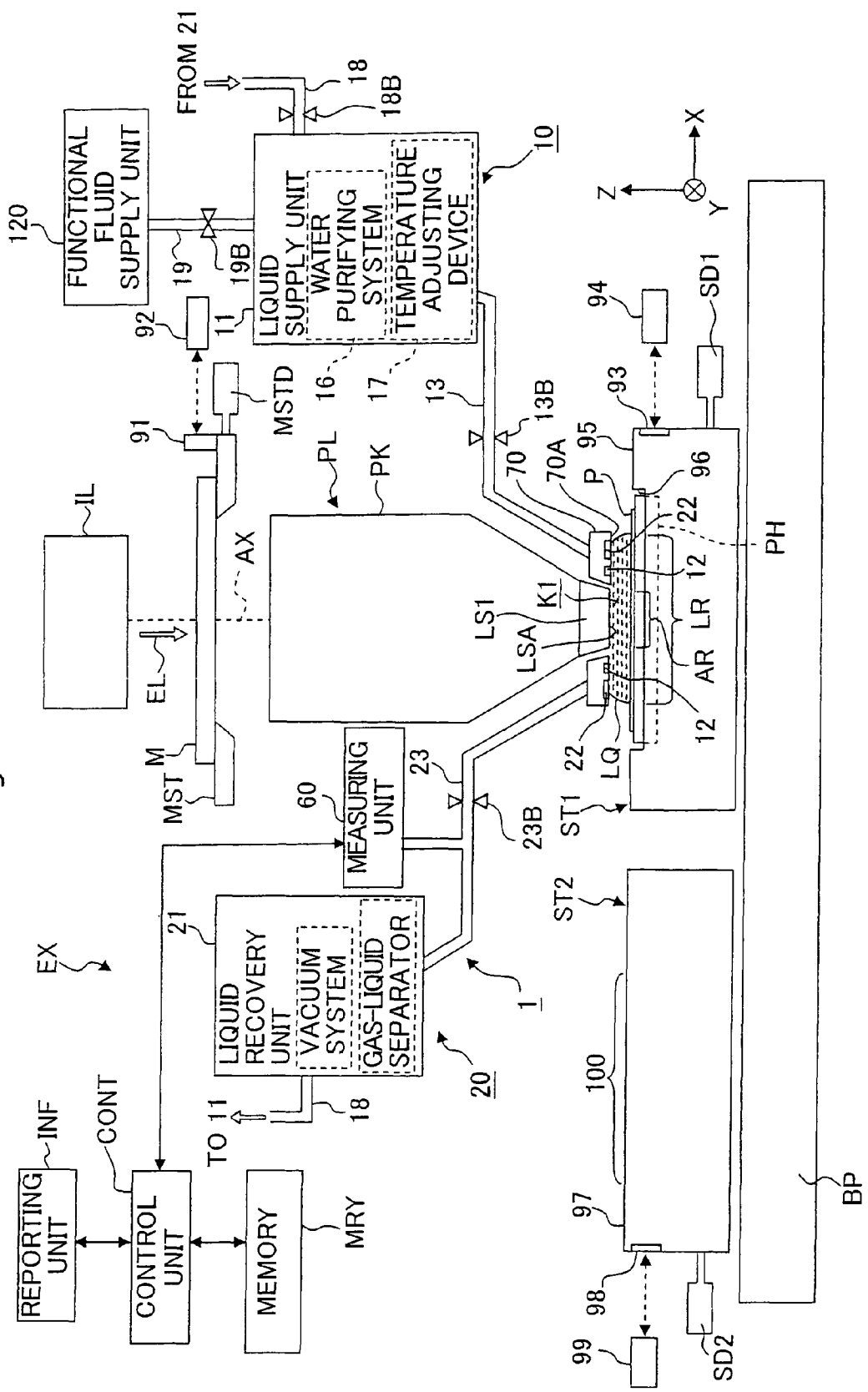
FIG. 1 is a schematic arrangement view showing an exposure apparatus according to a first embodiment.

FIG. 1 is a schematic arrangement view showing an exposure apparatus according to a first embodiment. In FIG. 1, the exposure apparatus EX includes a mask stage MST which is movable while holding a mask M; a substrate stage ST1 which includes a substrate holder PH for holding a substrate P and is movable while holding the substrate P on the substrate holder PH; a measuring stage ST2 which is provided with an optical measuring instrument for optically performing measurement concerning the exposure process and is movable independently from the substrate stage ST1; an illumination optical system IL which illuminates a mask M held on the mask stage MST with an exposure light beam EL; a projection optical system PL which projects an image of a pattern on the mask M illuminated with the exposure light beam EL to the substrate P held on the substrate stage ST1, and which exposes the image of the pattern on the substrate; and a control unit CONT which controls the overall operation of the exposure apparatus EX. To the control unit CONT, a reporting unit INF which reports information concerning the exposure process is connected. The reporting unit INF includes a display device (display), a warning device which issues a warning (alarm) by using sound or light, and the like. Furthermore, to the control unit CONT, a memory MRY for storing information concerning the exposure process is connected.

The exposure apparatus EX of this embodiment is a liquid immersion exposure apparatus to which a liquid immersion method is applied for improving the resolution and substantially widening the depth of focus by substantially shortening the exposure wavelength, and which includes a liquid immersion mechanism 1 for filling, with a liquid LQ, an optical path space K1 for an exposure light beam EL on a side of an image plane of the projection optical system PL. The liquid immersion mechanism 1 includes: a nozzle member 70 which is provided in the vicinity of the image plane of the projection optical system PL and which has a supply port 12 for supplying a liquid LQ and a recovery port 22 for recovering the liquid LQ; a liquid supply mechanism 10 for supplying the liquid LQ to the side of the image plane of the projection optical system PL through the supply port 12 provided in the nozzle member 70; and a liquid recovery mechanism 20 for recovering the liquid LQ on the side of the image plane of the projection optical system PL through the recovery port 22 provided in the nozzle member 70. The nozzle member 70 is formed into an annular shape so as to surround a first optical element LS1 which is included in among a plurality of optical elements constructing the projection optical system PL and is disposed most closely to the image plane of the projection optical system PL.

The exposure apparatus EX adopts a local liquid immersion method in which a liquid immersion area LR, of the liquid LQ supplied from the liquid supply mechanism 10, which is larger than the projection area AR and smaller than the substrate P, is locally formed on a part of the substrate P including the projection area AR of the projection optical system PL at least during projection of an image of a pattern on the mask M onto the substrate P. Specifically, the exposure apparatus EX fills, with the liquid LQ, an optical path space K1 between a lower surface LSA of the first optical element LS1 disposed most closely to the image plane of the projection optical system PL and an upper surface of the substrate P arranged on the side of the image plane of the projection optical system PL, and projects onto the substrate P an image of a pattern on the mask by irradiating the substrate P with the exposure light beam EL that has passed through the mask M via the liquid LQ between the projection optical system PL (first optical element LS1) and the substrate P and the projection optical system PL (first optical element LS1). The control unit CONT locally forms a liquid immersion area LR of the liquid LQ on the substrate P by supplying a predetermined amount of the liquid LQ to a surface of the substrate P with the liquid supply mechanism 10 and by recovering a predetermined amount of the liquid LQ on the substrate P with the liquid recovery mechanism 20.

Further, the exposure apparatus EX has a measuring unit 60 which measures at least one (liquid state) of the property and the components of the liquid LQ forming the liquid immersion area LR. The measuring unit 60 measures at least one of the property and components of the liquid LQ filled between the projection optical system PL and the object arranged on the side of the image plane of the projection optical system PL. In this embodiment, the measuring unit 60 measures the liquid LQ recovered by the liquid recovery mechanism 20.

In the liquid immersion mechanism 1, the liquid supply mechanism 10 includes a functional fluid supply unit 120 capable of supplying a functional fluid having a predetermined function different from that of the liquid LQ for forming the liquid immersion area LR.

This embodiment will now be explained as exemplified by a case using the scanning type exposure apparatus (so-called scanning stepper) as the exposure apparatus EX which exposes a pattern formed on the mask M on the substrate P while synchronously moving the mask M and the substrate P in mutually different directions (opposite directions) in the scanning direction. In the following explanation, the X axis direction is the synchronous movement direction (scanning direction) of the mask M and the substrate P in a horizontal plane, the Y axis direction (non-scanning direction) is the direction orthogonal to the X axis direction in the horizontal plane, and the Z axis direction is the direction which is perpendicular to the X axis direction and the Y axis direction and is coincident with an optical axis AX of the projection optical system PL. The directions of rotation (inclination) about the X axis, the Y axis, and the Z axis are θX, θY, and θZ directions, respectively. The term "substrate" used herein includes a substrate with a photosensitive material (resist) coated on a base material of a semiconductor wafer, or the like, and the term "mask" includes a reticle formed with a device pattern to be subjected to the reduction projection to the substrate.

The illumination optical system IL includes an exposure light source, an optical integrator which uniformizes the illuminance of a light flux radiated from the exposure light source, a condenser lens which collects the exposure light beam EL from the optical integrator, a relay lens system, and a field diaphragm which sets an illumination area on the mask M to be illuminated with the exposure light beam EL. A predetermined illumination area on the mask M is illuminated with the exposure light beam EL having a uniform illuminance distribution by the illumination optical system IL. Lights usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, as the liquid LQ for forming the liquid immersion area LR, pure or purified water is used. Pure water can transmit emission lines (g-ray, h-ray, i-ray) radiated, for example, from a mercury lamp and far ultraviolet light beams (DUV light beams) such as the KrF excimer laser beam (wavelength: 248 nm) as well as an ArF excimer laser beam.

The mask stage MST is movable while holding the mask M. The mask stage MST holds the mask M by vacuum adsorption (or electrostatic adsorption). The mask stage MST is two-dimensionally movable in a plane perpendicular to the optical axis AX of the projection optical system PL, that is, in an XY plane and finely rotatable in the θZ direction while holding the mask M by driving of the mask stage driving unit MSTD, including a linear motor and the like, controlled by the control unit CONT. The mask stage MST is also movable in the Z axis direction and finely movable in the θX and θY directions. On the mask stage MST, a movement mirror 91 which moves together with the mask stage MST is fixedly provided. At a position facing the movement mirror 91, a laser interferometer 92 is provided. The two-dimensional position and the angle of rotation in the θZ direction (including the angles of rotation in θX and θY directions according to circumstances) of the mask M on the mask stage MST are measured by the laser interferometer 92 in real time. The result of measurement by the laser interferometer 92 is outputted to the control unit CONT. The control unit CONT drives the mask stage driving unit MSTD based on the result of measurement made by the laser interferometer 92 and controls the position of the mask M held on the mask stage MST.

The projection optical system PL projects the image of the pattern on the mask to the substrate P at a predetermined projection magnification β. The projection optical system PL includes a plurality of optical elements, and these optical elements are held by a barrel PK. In this embodiment, the projection optical system PL is the reduction system having the projection magnification β which is, for example, ¼, ⅕, or ⅛. The projection optical system PL may be any one of either the same magnification system or the enlarging system. The projection optical system PL may be any one of a dioptric system including no cataptric element, a cataptric system including no dioptric element, and a catadioptric system including cataptric and dioptric elements. Among a plurality of optical elements constructing the projection optical system PL, the first optical element LS1 disposed most closely to the image plane of the projection optical system PL is exposed from the barrel PK.

The substrate stage ST1 has a substrate holder PH which holds a substrate P. The substrate stage ST1 is arranged on the side of the image plane of the projection optical system PL, and is movable on a base member BP on the side of the image plane of the projection optical system. The substrate holder PH holds the substrate P by, for example, vacuum adsorption. On the substrate stage ST1, a concave 96 is provided, and the substrate holder PH for holding the substrate P is arranged in the concave 96. The upper surface 95 of the substrate stage ST1, except for the concave 96, is formed into a flat surface (flat portion) having substantially the same height (flush with) as the upper surface of the substrate P held on the substrate holder P.

The substrate stage ST1 is two-dimensionally movable in an XY plane and finely rotatable in the θZ direction on the base member BP, while holding the substrate P via the substrate holder PH, according to driving of the substrate stage driving unit SD1 which includes a linear motor and the like and which is controlled by control unit CONT. Furthermore, the substrate stage ST1 is also movable in the Z axis direction, θX direction, and θY direction. Therefore, the upper surface of the substrate P supported by the substrate stage ST1 is movable in six free directions of the X axis, Y axis, Z axis, θX, θY, and θZ directions. On a side surface of the substrate stage ST1, a movement mirror 93 that moves together with the substrate stage ST1 is fixedly provided. At a position facing the movement mirror 93, a laser interferometer 94 is provided. The two-dimensional position and the angle of rotation of the substrate P on the substrate stage ST1 are measured in real time by the laser interferometer 94. Further, the exposure apparatus EX includes a focus leveling detection system (not shown) using an oblique incidence system which detects surface position information of the upper surface of the substrate P supported on the substrate stage ST1 as disclosed in, for example, Japanese Patent Application Laid-open No. 8-37149. The focus leveling detection system detects surface position information of the upper surface of the substrate P (positional information in the Z axis direction and inclination information in the θZ and θY directions of the substrate P). The focus leveling detection system may detect surface position information of the substrate P through the liquid LQ in the liquid immersion area LR, may detect surface position information of the substrate P not through the liquid LQ of the liquid immersion area LR, or may be a combination of a system which detects the surface position information of the substrate P through the liquid LQ and a system which detects surface position information of the substrate P not through the liquid LQ. Alternatively, the focus leveling detection system may adopt a system using a capacitance type sensor. The result of measurement made by the laser interferometer 94 is outputted to the control unit CONT. The result of detection by the focus leveling detection system is also outputted to the control unit CONT. The control unit CONT matches the upper surface of the substrate P with the image plane of the projection optical system by driving the substrate stage driving unit SD1 based on the result of detection by the focus leveling detection system and by controlling the focus position (Z position) and angles of inclination (θX and θY) of the substrate P, and performs positional control in the X axis direction, Y axis direction, and θZ direction of the substrate P based on the result of measurement made by the laser interferometer 94.

The measuring stage ST2 is provided with various optical measuring instruments (including measuring members) for optically performing measurements concerning the exposure process. The measuring stage ST2 is arranged on the side of the image plane of the projection optical system PL, and is movable on the base member BP on the side of the image plane of the projection optical system PL. The measuring stage ST2 is two-dimensionally movable in an XY plane and finely rotatable in the θZ direction on the base member BP by the driving of the measuring stage driving unit SD2, which includes a linear motor and the like and which is controlled by the control unit CONT, in a state that the optical measuring instruments are provided on the measuring stage ST2. Furthermore, the measuring stage ST2 is also movable in the Z axis direction, θX direction, and θY direction. Therefore, the measuring stage ST2 is movable in the six free directions of the X axis, Y axis, Z axis, θX, θY, and θZ directions similarly to the substrate stage ST1. On a side surface of the measuring stage ST2, a movement mirror 98 movable together with the measuring stage ST2 is fixedly provided. At a position facing the movement mirror 98, a laser interferometer 99 is provided. The two-dimensional position and angle of rotation of the measuring stage ST2 are measured in real time by the laser interferometer 99, and the control unit CONT controls the position of the measuring stage ST2 based on the result of measurement by the laser interferometer 99.

The control unit CONT can move the substrate stage ST1 and the measuring stage ST2 independently from each other on the base BP by using the stage driving unit SD1 and the stage driving unit SD2, respectively. The control unit CONT can make the upper surface 95 of the substrate stage ST1 or the upper surface of the substrate P held on the substrate stage ST1 face the lower surface LSA of the projection optical system PL by moving the substrate stage ST1 to a position below or under the projection optical system PL. Similarly, the control unit CONT can make the upper surface 97 of the measuring stage ST2 face the lower surface LSA of the projection optical system PL by moving the measuring stage ST2 to a position below or under the projection optical system PL.

The substrate stage ST1 and the measuring stage ST2 are provided at positions side by side, and the upper surface 95 of the substrate stage ST1 including the upper surface of the substrate P and the upper surface 97 of the measuring stage ST2 are provided at a substantially same position in height.

Figure 2:
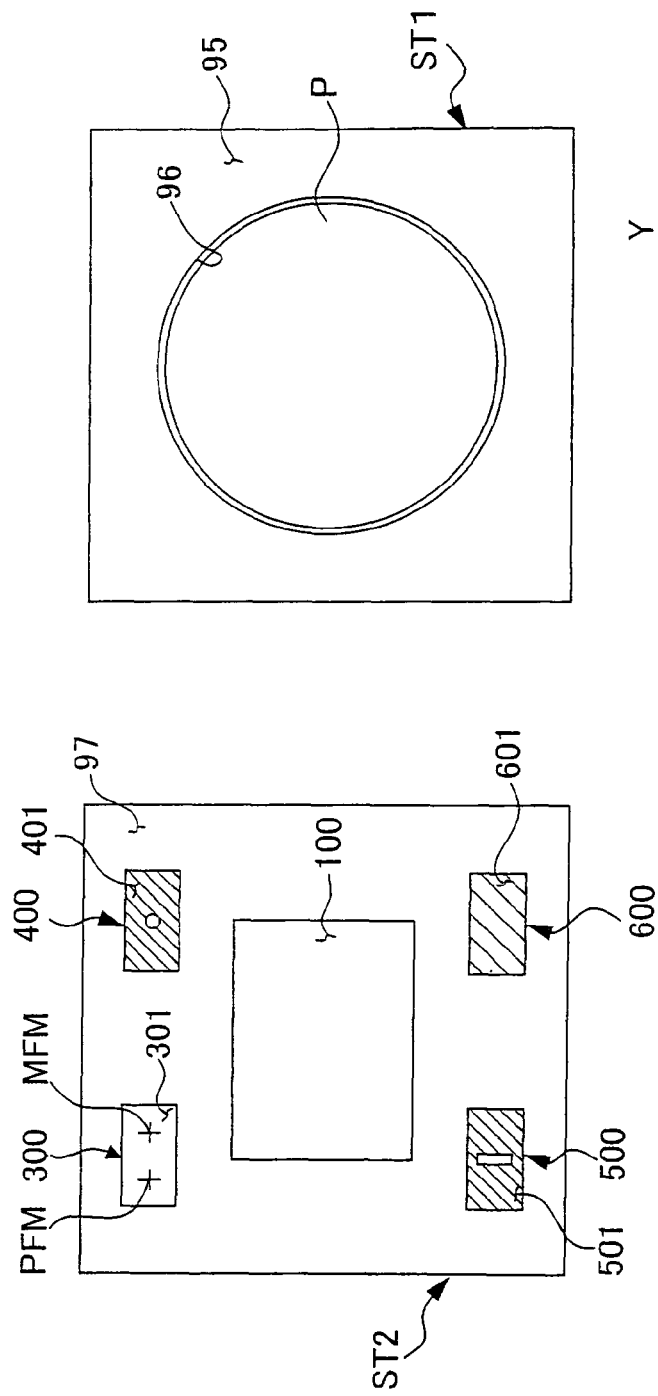
FIG. 2 is a plan view of a stage viewed from above.

FIG. 2 is a plan view of the substrate stage ST1 and the measuring stage ST2 as seen from above. In FIG. 2, on the upper surface 97 of the measuring stage ST2, a reference member 300 is provided as an optical measuring instrument (measuring member). The reference member 300 is used when a positional relationship (baseline amount) between a projection position of the image of the pattern and a detection reference of a substrate alignment system (not shown) in the XY plane is measured for defining or determining an alignment position of the substrate P with respect to the image of the pattern on the mask M via the projection optical system PL. On the upper surface 301 of the reference member 300, a first reference mark MFM and a second reference mark PFM are formed in a predetermined positional relationship. The first reference mark MFM is detected by a mask alignment system of the VRA (visual reticle alignment) system as disclosed in, for example, Japanese Patent Application Laid-open No. 7-176468. The mask alignment system of the VRA system measures the position of the mark by irradiating the mark with light and processing image data of the mark imaged with a CCD camera or the like. The second reference mark PFM is detected by a substrate alignment system of the FIA (field image alignment) system as disclosed in Japanese Patent Application Laid-open No. 4-65603. The substrate alignment system of the FIA system irradiates a target mark with a detecting light flux which is broadband so that a photosensitive material on the substrate P is not exposed thereto, picks-up an image of the target mark formed on a light receiving surface due to a light reflected from the target mark and an image of an index that is not shown (index pattern on an index plate provided in the substrate alignment system) by using an image pickup device (CCD or the like), and process image pickup signals of these images to measure the position of the mark.

On the upper surface 97 of the measuring stage ST2, an upper plate constructing a part of an unevenness sensor 400 as an optical measuring instrument for measuring illuminance unevenness as disclosed in Japanese Patent Application Laid-open No. 57-117238 and/or measuring a fluctuation amount of transmittance of the projection optical system PL with respect to the exposure light beam EL as disclosed in Japanese Patent Application Laid-open No. 2001-267239, an upper plate constructing a part of an spatial image measuring sensor 500 as disclosed in Japanese Patent Application Laid-open No. 2002-14005, and an upper plate constructing a part of an irradiance sensor (illuminance sensor) 600 as disclosed in Japanese Patent Application Laid-open No. 11-16816, are provided. On the upper surface 97 of the measuring stage ST2, the upper surfaces 401, 501, and 601 of these sensors 400, 500, and 600, respectively, are arranged.

In this embodiment, the upper surface 97 of the measuring stage ST2 including the upper surfaces 301, 401, 501, and 601 of the optical measuring instruments 300, 400, 500 and 600, respectively, is substantially flat, and the upper surface 97 of the measuring stage ST2 and the upper surfaces 301, 401, 501 and 601 of the optical measuring instruments 300, 400, 500 and 600, respectively, are substantially flush with one another.

In this embodiment, the first reference mark MFM formed on the reference member 300 is detected by the mask alignment system via the projection optical system PL and the liquid LQ, and the second reference mark PFM is detected by the substrate alignment system not via the projection optical system PL and the liquid LQ. In this embodiment, since liquid immersion exposure process for exposing the substrate P is performed by irradiating the substrate P with an exposure light beam EL via the projection optical system PL and the liquid LQ, the unevenness sensor 400, the spatial image measuring sensor 500, the irradiance sensor 600 and the like, which perform the measurement process using the exposure light beam EL, receive the exposure light beam EL via the projection optical system PL and the liquid LQ according to the liquid immersion exposure process.

Thus, the measuring stage ST2 is a dedicated stage for performing a measurement process concerning the exposure process, and does not hold the substrate P. The substrate stage ST1 is not provided with any optical measuring instrument for performing measurements concerning the exposure process. The measuring stage ST2 is disclosed in detail in, for example, Japanese Patent Application Laid-open No. 11-135400, European Patent Publication No. 1,041,357, and the like.

Only parts of, for example, the optical systems of the sensors 400, 500, and 600 may be installed in the measuring stage ST2, or the entire sensors may be installed in the measuring stage ST2. The optical measuring instruments to be installed in the measuring stage ST2 are not limited to the above-described sensors 400, 500, 600 and the reference member 300, and any optical instrument(s) (measuring member(s)) can be installed in the measuring stage ST2 provided that such instrument or instruments perform measurements concerning the exposure process. It is also allowable that parts of the sensors 400, 500, 600 and the reference member 300 are provided in the substrate stage ST1.

The measuring stage ST2 arranged on the side of the image plane of the projection optical system PL has a predetermined area 100 formed so as not to pollute the liquid LQ. The predetermined area 100 is set to an area as a part of the upper surface 97 of the measuring stage ST2. In this embodiment, the predetermined area 100 is an area of the upper surface 97, of the measuring stage ST2, except for the areas of the optical measuring instruments 300, 400, 500 and 600, and is set at substantially the center of the upper surface 97 of the measuring stage ST2. The size of the predetermined area 100 is set to be larger than the liquid immersion area LR. The predetermined area 100 is substantially flush with the upper surfaces 301, 401, 501 and 601 of the optical measuring instruments 300, 400, 500 and 600, respectively. In this embodiment, the upper surface 97 of the measuring stage ST2 includes the upper surface of the predetermined area 100 and the upper surfaces 301, 401, 501 and 601 of the optical measuring instruments 300, 400, 500 and 600, respectively.

A predetermined treatment is performed for a partial area of the upper surface 97 of the measuring stage PT2, and by this predetermined treatment, the predetermined area 100 that does not pollute the liquid LQ is formed. Here, the phrase "does not pollute the liquid LQ" means a state in which any elution (entering and mixing) of a contaminant or pollutant (metal, organic ion, inorganic ion, and the like) including a foreign substance from the surface of the predetermined area 100 is suppressed to be not more than a predetermined permissible amount. In other words, the predetermined area 100 is made of a material which does not substantially generate any contaminant in the liquid LQ when the predetermined area 100 comes into contact with the liquid LQ. Therefore, even when the liquid LQ comes into contact with the predetermined area 100, the pollution of the liquid LQ is prevented. The size of the predetermined area 100 is larger than the liquid immersion area LR, so that when the liquid immersion area LR of the liquid LQ is formed on the upper surface 97 of the measuring stage ST2 including the predetermined area 100, the pollution of the liquid LQ can be prevented by forming the liquid immersion area LR on the inner side of the predetermined area 100.

In this embodiment, ceramics is used for the base material forming the upper surface 97 of the measuring stage ST2, and as a treatment for preventing the pollution of the liquid LQ, a treatment (surface treatment) of coating PFA (copolymer of ethylene tetrafluoride ($C_2F_4$) and perfluoroalkoxyethylene) on the base material (ceramics) forming the upper surface 97 is performed. In the following explanation, the treatment of coating PFA is referred to as "PFA treatment".

In this embodiment, the predetermined area 100 is formed on a partial area of the upper surface 97 of the measuring stage ST2 by performing the PFA treatment, so that elution (entering and mixing) of a contaminant (metal, organic ion, inorganic ion and the like) including a foreign substance into the liquid LQ from the predetermined area 100 can be suppressed. Therefore, even when the predetermined area 100 comes into contact with the liquid LQ, the liquid LQ is prevented from being polluted, whereby the influence of the pollution on the liquid LQ is reduced.

The PFA is liquid-repellent (lyophobic) to the liquid (water) LQ, and even when the liquid immersion area LR is formed on the predetermined area 100, the shape, size and the like of the liquid immersion area LR can be maintained at a desired state by using the liquid immersion mechanism 1. In addition, when an operation for removing (recovering) the liquid LQ from the predetermined area 100 is performed, the liquid LQ can be prevented from remaining on the predetermined area 100.

Here, although a treatment to prevent the pollution of the liquid LQ is performed for a partial area on the upper surface 97 of the measuring stage ST2, it is also allowable that the treatment to prevent the pollution of the liquid LQ is performed for the entire upper surface 97 of the measuring stage ST2 including the upper surfaces 301, 401, 501 and 601 of the optical measuring instruments 300, 400, 500 and 600, respectively. In this case, the treatment for the area except for the areas of the optical measuring instruments 300, 400, 500 and 600 and the treatment for the upper surfaces 301, 401, 501 and 601 of the optical measuring instruments 300, 400, 500 and 600 may be different from each other. For example, regarding the upper surface 97 of the measuring stage ST2, the PFA treatment is performed for the area on the upper surface 97 except for the areas of the optical measuring instruments 300, 400, 500 and 600, and a treatment of coating a material other than TFA is performed for the upper surfaces 301, 401, 501 and 601 of the optical measuring instruments 300, 400, 500 and 600, respectively. As a material for coating the upper surfaces 301, 401, 501 and 601 of the optical measuring instruments 300, 400, 500 and 600, a material which does not pollute the liquid LQ, which is repellent to the liquid LQ, and which has optical transparency is preferably used. Those usable as this material include, for example, "Cytop (trademark)" made by Asahi Glass Co., Ltd. Accordingly, even when the liquid immersion area LR is arranged in an area other than the predetermined area 100 of the upper surface 97 of the measuring stage ST2, the liquid LQ can be prevented from being polluted, and the shape, size and the like of the liquid immersion area LR can be maintained at a desired state. When an operation for removing the liquid LQ from the upper surface 97 of the measuring stage ST2 is performed, the liquid LQ can be prevented from remaining on the upper surface 97. When the upper surface (for example, 301) of the optical measuring instrument is subjected to the anti-pollution treatment, at least a part of the upper surface can be used as the predetermined area 100.

The material to be used for the surface treatment of the predetermined area 100 (upper surface 97) is not limited to PFA, and any material can be used provided that the material does not pollute the liquid LQ, and the material can be arbitrarily selected according to the base material forming the upper surface 97 of the measuring stage ST2 and the properties (kind) of the liquid LQ used. Here, although the predetermined area 100 is formed by performing the surface treatment for the partial area of the upper surface 97 of the measuring stage ST2, it is also possible that, for example, an opening (concave) is formed on a part of the upper surface 97 of the measuring stage ST2; a plate member made of PFA or the like is arranged on the inner side of the concave; and the upper surface of this plate member may be set as the predetermined area 100. Also when the plate member is arranged in the concave of the upper surface 97 of the measuring stage ST2, it is preferable that the upper surface of the plate member is flat, and it is desirable that the upper surface of the plate member is substantially flush with the upper surface 97 of the measuring stage ST2 including the upper surfaces 301, 401, 501, and 601 of the respective optical measuring instruments.

Figure 3:
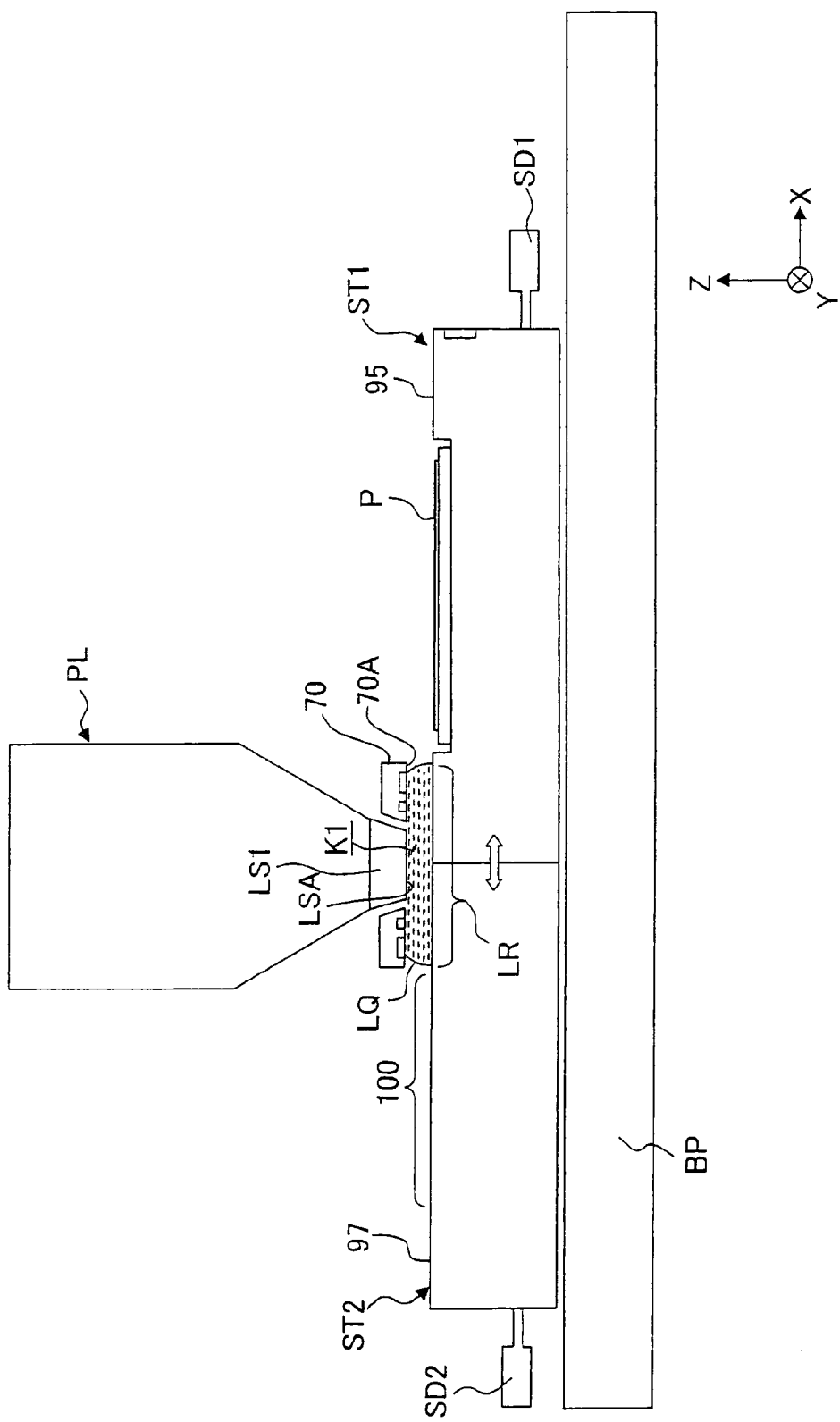
FIG. 3 is a drawing showing a state that a liquid immersion area moves between a substrate stage and a measuring stage.

FIG. 3 is a drawing showing the liquid immersion area LR of the liquid LQ in a state that the liquid immersion area LR is moving between the surface of the substrate stage ST1 and the surface of the measuring stage ST2. As shown in FIG. 3, the liquid immersion area LR formed on the side of the image plane (under or below the first optical element LS1) of the projection optical system PL is movable between the surface of the substrate stage ST1 and the surface of the measuring stage ST2. When moving the liquid immersion area LR, the control unit CONT moves the substrate stage ST1 and the measuring stage ST2 together in the XY plane within the area including the position immediately below or under the projection optical system PL by using the stage driving units SD1 and SD2 in a state that the substrate stage ST1 and the measuring stage ST2 are in proximity to or in contact with each other. By moving the substrate stage ST1 and the measuring stage ST2 together, the control unit CONT can move the liquid immersion area LR between the upper surface 95 of the substrate stage ST1 and the upper surface 97 of the measuring stage ST2 while retaining the liquid LQ between the projection optical system PL and at least one of the upper surface 95 of the substrate stage ST1 and the upper surface 97 of the measuring stage ST2. By doing so, in a state that the optical path space K1 on the side of the image plane of the projection optical system PL is filled with the liquid LQ while overflow of the liquid LQ from the gap between the substrate stage ST1 and the measuring stage ST2 is restrained or suppressed, the liquid immersion area LR can be moved between the upper surface of the substrate stage ST1 and the upper surface of the measuring stage ST2.

Accordingly, since the liquid immersion area LR of the liquid LQ can be moved between the upper surface 95 of the substrate stage ST1 and the upper surface 97 of the measuring stage ST2 without the process of entire recovery of the liquid LQ and the process of re-supply of the liquid LQ, the time from the completion of an exposure operation for a substrate P on the substrate stage ST1 to the start of an exposure operation for the next substrate P can be shortened, and the throughput can be thus improved. On the side of the image plane of the projection optical system PL, the liquid LQ is always present, so that an adhesion mark (so-called watermark) of the liquid LQ can be effectively prevented.

Next, the liquid supply mechanism 10 and the liquid recovery mechanism 20 of the liquid immersion mechanism 1 will be explained with reference to FIG. 1. The liquid supply mechanism 10 supplies the liquid LQ to the side of the image plane of the projection optical system PL. The liquid supply mechanism 10 includes a liquid supply unit 11 which is capable of feeding out the liquid LQ and a supply tube 13 whose one end is connected to the liquid supply unit 11. At an intermediate position of the supply tube 13, a valve 13B which opens and closes the flow channel in this supply tube 13 is provided. The operation of the valve 13B is controlled by the control unit CONT. The other end of the supply tube 13 is connected to the nozzle member 70. Inside the nozzle member 70, an internal flow channel (supply flow channel) connecting the other end of the supply tube 13 and the supply port 12 are formed. In this embodiment, the liquid supply mechanism 10 supplies pure or purified water, and the liquid supply unit 11 includes a water purifying system 16; a temperature adjusting device 17 which adjusts the temperature of the liquid (pure water) LQ to be supplied; and the like. Furthermore, the liquid supply unit 11 also includes a tank for accommodating the liquid LQ, a pressurizing pump, a filter unit for removing foreign substances in the liquid LQ, and the like. The liquid supply operation of the liquid supply unit 11 is controlled by the control unit CONT. As the water purifying device, instead of providing a water purifying device in the exposure apparatus EX, a water purifying device of a factory in which the exposure apparatus EX is installed may be used. It is not necessarily indispensable that the exposure apparatus body EX includes all of the tank, pressurizing pump, and filter unit, and the like, of the liquid supply mechanism 10. Instead, the facilities of a factory, etc., in which the exposure apparatus main body EX is installed may be used.

In this embodiment, the valve 13B provided in the supply tube 13 adopts a so-called normal close system which mechanically closes the flow channel of the supply tube 13 when the drive source (power source) of the exposure apparatus EX (control unit CONT) stops due to, for example, a power cut. Thereby, even when an abnormality such as a power cut (electric power failure) occurs, the liquid LQ can be prevented from leaking from the supply port 12.

The liquid recovery mechanism 20 recovers the liquid LQ on the side of the image plane of the projection optical system PL. The liquid recovery mechanism 20 includes a liquid recovery unit 21 capable of recovering the liquid. LQ and a recovery tube 23 whose one end is connected to the liquid recovery unit 21. At an intermediate position of the recovery tube 23, a valve 23B which opens and closes the flow channel in this recovery tube 23 is provided. The operation of the valve 23B is controlled by the control unit CONT. The other end of the recovery tube 23 is connected to the nozzle member 70. Inside the nozzle member 70, an internal flow channel (recovery flow channel) which connects the other end of the recovery tube 23 and the recovery port 22 is formed. The liquid recovery unit 21 includes a vacuum system (suction unit) such as a vacuum pump, a gas-liquid separator which separates the recovered liquid LQ from a gas, a tank for accommodating the recovered liquid LQ, and the like. It is not necessarily indispensable that the exposure apparatus body EX includes the vacuum system, the gas-liquid separator, the tank, and the like of the liquid recovery mechanism 20. Instead, facilities of a factory, etc., in which the exposure apparatus body EX is installed may be used.

The supply port 12 for supplying the liquid LQ and the recovery port 22 for recovering the liquid LQ are formed in the lower surface 70A of the nozzle member 70. The lower surface 70A of the nozzle member 70 is provided at a position at which the lower surface 70A can face or can be opposite to the upper surface of the substrate P, the upper surface 95 of the substrate stage ST1, and the upper surface 97 of the measuring stage ST2. The nozzle member 70 is an annular member provided so as to surround the side surfaces of the first optical element LS1, and the supply port 12 is provided as a plurality of supply ports 12 at the lower surface 70A of the nozzle member 70 so as to surround the first optical element LS1 of the projection optical system PL (the optical axis AX of the projection optical system PL). At the lower surface 70A of the nozzle member 70, the recovery port 22 is arranged at a position outwardly away, than each of the supply ports 12, from the first optical element LS1 so as to surround the first optical element LS1 and each of the supply ports 12.

The control unit CONT locally forms a liquid immersion area LR of the liquid LQ on the substrate P by supplying a predetermined amount of the liquid LQ to the substrate P by using the liquid supply mechanism 10, and by recovering a predetermined amount of the liquid LQ from the surface of the substrate P by using the liquid recovery mechanism 20. When forming the liquid immersion area LR of the liquid LQ, the control unit CONT drives each of the liquid supply unit 11 and the liquid recovery unit 21. When the liquid LQ is fed out from the liquid supply unit 11 under control by the control unit CONT, the liquid LQ fed out from the liquid supply unit 11 flows through the supply tube 13, and is then supplied to the side of the image plane of the projection optical system PL from the supply ports 12 via the supply flow channel of the nozzle member 70. When the liquid recovery unit 21 is driven under control by the control unit CONT, the liquid LQ on the side of the image plane of the projection optical system PL flows into the recovery flow channel of the nozzle member 70 through the recovery ports 22, and is recovered by the liquid recovery unit 21 after flowing through the recovery tube 23.

In this embodiment, the liquid LQ recovered by the liquid recovery mechanism 20 is returned to the liquid supply unit 11 of the liquid supply mechanism 10. Namely, the exposure apparatus EX of this embodiment includes a circulation system which circulates the liquid LQ between the liquid supply mechanism 10 and the liquid recovery mechanism 20. The liquid LQ returned to the liquid supply unit 11 of the liquid supply mechanism 10 is purified in the water purifying system 16, and then supplied again to the side of the image plane (surface of the substrate P) of the projection optical system PL. All of the liquid LQ recovered by the liquid recovery mechanism 20 may be returned to the liquid supply mechanism 10, or a part of the recovered liquid LQ may be returned to the liquid supply mechanism 10. Alternatively, instead of returning the liquid LQ recovered by the liquid recovery mechanism 20 to the liquid supply mechanism 10, the liquid LQ, supplied from another supply source or tap water, may be purified by the water purifying system 16 and then may be supplied to the side of the image plane of the projection optical system PL. The structure of the liquid immersion mechanism 1 including the nozzle member 70, and the like is not limited to the above-described structure, and the structures described in, for example, European Patent Application Publication No. 1420298, and International Patent Application Publication Nos. 2004/055803, 2004/057589, 2004/057590, and 2005/029559 may be also adopted.

Figure 4:
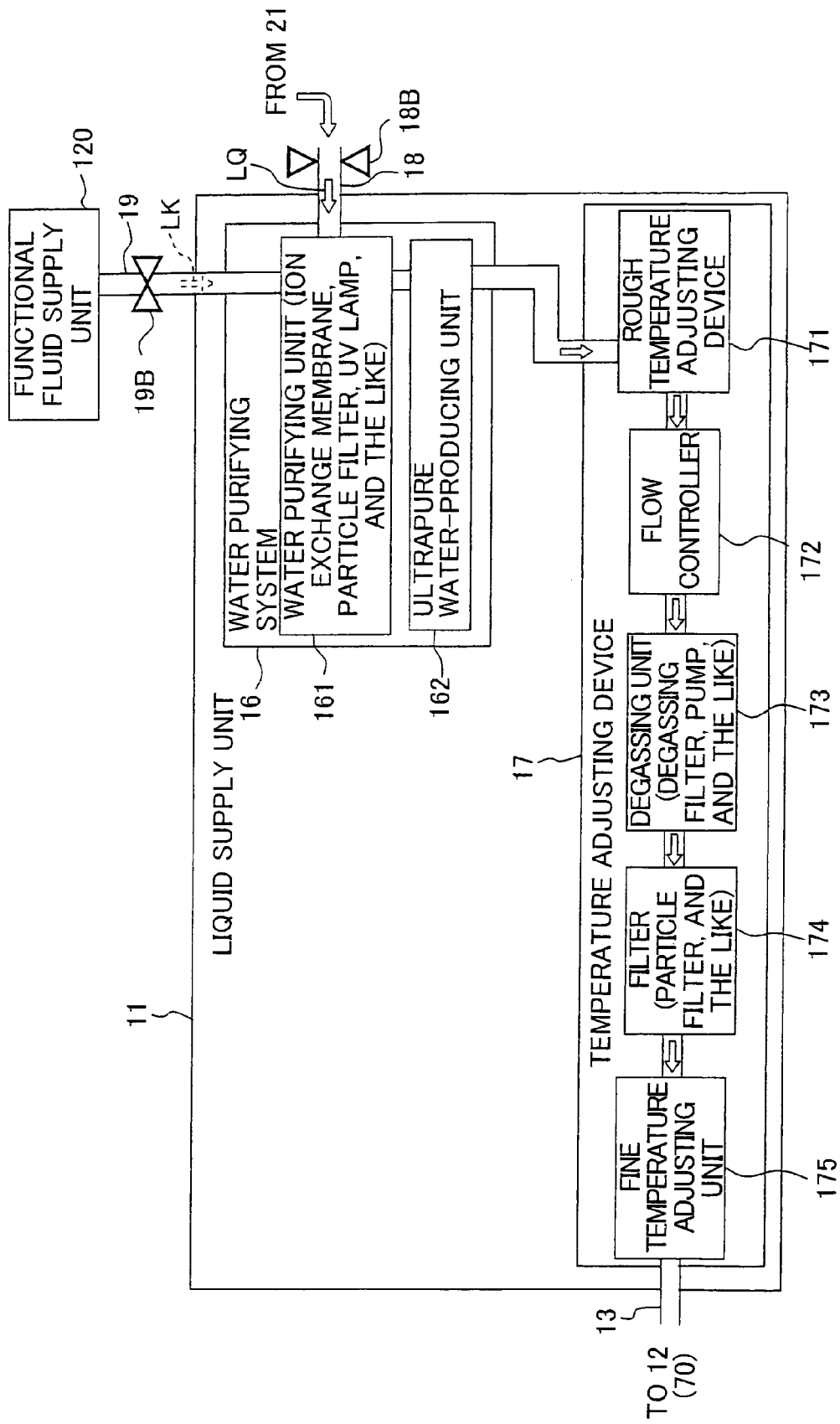
FIG. 4 is a schematic arrangement view showing a liquid supply unit.

Next, the liquid supply unit 11 will be explained with reference to FIG. 4. FIG. 4 shows the construction of the liquid supply unit 1 in detail. The liquid supply unit 11 includes a water purifying system 16 and a temperature adjusting device 17 which adjusts the temperature of the liquid LQ produced by the water purifying system 16. The water purifying system 16 includes a water purifying unit 161 which produces pure water with a predetermined purity by purifying water containing suspended solids and impurities, and an ultrapure water-producing unit 162 which produces highly-pure water (ultrapure water) by further removing impurities from the pure water produced by the water purifying unit 16. The water purifying unit 161 (or ultrapure water-producing unit 162) includes a liquid reforming member such as an ion exchange membrane or a particle filter, and a liquid reforming unit such as an ultraviolet irradiation unit (UV lamp), and by the liquid reforming member and liquid reforming unit, a specific resistance, an amount of foreign substances (particles and bubbles), total organic carbon, an amount of bacteria, and the like of the liquid are adjusted to desired values.

As described above, the liquid LQ recovered by the liquid recovery mechanism 20 is returned to the liquid supply unit 11 of the liquid supply mechanism 10. Specifically, the liquid LQ recovered by the liquid recovery mechanism 20 is supplied to the water purifying system 16 (water purifying unit 161) of the liquid supply unit 11 via a return tube 18. In the return tube 18, a first valve 18B which opens and closes the flow channel in the return tube 18 is provided. The water purifying system 16 purifies the liquid LQ, returned via the return tube 18, by using the liquid reforming member and the liquid reforming unit, and then supplies the liquid LQ to the temperature adjusting device 17. To the water purifying system 16 (water purifying unit 161) of the liquid supply unit 11, a functional fluid supply unit 120 is connected via a supply tube 19. The functional fluid supply unit 120 can supply a functional fluid LK having a predetermined function different from that of the liquid LQ for forming the liquid immersion area LR. In this embodiment, the functional fluid supply unit 120 supplies a functional fluid LK that has a cleaning effect or a sterilization effect, or a functional fluid LK having both of these effects. As the functional fluid LK, for example, ozone water, a solution or a water-soluble organic solvent containing surfactant, antibacterial agent, disinfectant, sterilizer and the like can be used. In this embodiment, as the functional fluid LK, hydrogen peroxide solution is used. In the supply tube 19, a second valve 19B which opens and closes the flow channel in the supply tube 19 is provided. The control unit CONT stops the supply of the functional fluid LK by closing the flow channel in the supply tube 19 by actuating the second valve 19B when supplying the liquid LQ by opening the flow channel in the return tube 18 by actuating the first valve 18B. On the other hand, the control unit CONT stops the supply of the liquid LQ by closing the flow channel in the return tube 18 by actuating the first valve 18B when supplying the functional fluid LK by opening the flow channel in the supply tube 19 by actuating the second valve 19B.

The temperature adjusting device 17 adjusts the temperature of the liquid (pure water) LQ which is produced by the water purifying system 16 and supplied to the supply tube 13, and one end of the temperature adjusting device is connected to the water purifying system 16 (ultrapure water-producing unit 162) and the other end of the temperature adjusting device 17 is connected to the supply tube 13, and after adjusting the temperature of the liquid LQ produced by the water purifying system 16, the temperature adjusting device feeds the temperature-adjusted liquid LQ to the supply tube 13. The temperature adjusting device 17 includes a rough temperature adjusting unit 171 which roughly adjusts the temperature of the liquid LQ supplied from the ultrapure water-producing unit 162 of the water purifying system 16, a flow controller 172 called a mass flow controller which is provided on a downstream side of the flow channel (on a side of the supply tube 13) of the rough temperature adjusting device 171 and controls an amount per unit time of the liquid LQ to be flown to the side of the supply tube 13, a degassing unit 173 for lowering the dissolved gas concentration (dissolved oxygen concentration, dissolved nitrogen concentration) in the liquid LQ which has passed through the flow controller 172, a filter 174 for removing foreign substances (fine particles, air bubbles) in the liquid LQ degassed by the degassing unit 173, and a fine temperature adjusting unit 175 which finely adjusts the temperature of the liquid LQ which has passed through the filter 174.

The rough temperature adjusting unit 171 adjusts the temperature of the liquid LQ fed from the ultrapure water-producing unit 162 at an accuracy as rough as ±0.1° C. with respect to a target temperature (for example, 23° C.). The flow controller 172 is arranged between the rough temperature adjusting unit 171 and the degassing unit 173, and controls the flow rate per unit time of the liquid LQ, temperature-adjusted by the rough temperature adjusting unit 171, to the side of the degassing unit 173.

The degassing unit 173 is arranged between the rough temperature adjusting unit 171 and the fine temperature adjusting unit 175, more specifically, between the flow controller 172 and the filter 174, and degasses the liquid LQ fed from the flow controller 172 to lower the dissolved gas concentration (dissolved oxygen concentration, dissolved nitrogen concentration) in the liquid LQ. As the degassing unit 173, a publicly-known degassing unit such as a decompressor which performs degassing by reducing the pressure of the supplied liquid LQ can be used. In addition, a device including a degassing filter which separates gas from liquid in the liquid LQ by using a filter such as a hollow-fiber membrane filter and removes the separated gas component by using a vacuum system, or a device including a degassing pump which separates gas from liquid of the liquid LQ by using a centrifugal force and removes the separated gas component by using a vacuum system, can also be used. The degassing unit 173 adjusts the dissolved gas concentration to a desired value by using a liquid reforming member including the degassing filter and a liquid reforming unit including the degassing pump.

The filter 174 is arranged between the rough temperature adjusting unit 171 and the fine temperature adjusting unit 175, more specifically, between the degassing unit 173 and the fine temperature adjusting unit 175, and removes foreign substances in the liquid LQ fed from the degassing unit 173. When the liquid LQ passes through the flow controller 172 and the degassing unit 173, there is a possibility that a slight amount of foreign substances (particles) is mixed with the liquid LQ. However, by providing the filter 174 on the downstream side (side of the supply tube 13) of the flow controller 172 and the degassing unit 173, the foreign substances can be removed by this filter 174. As the filter 174, a publicly-known filter such as a hollow fiber membrane filter or a particle filter can be used. The filter 174 including a liquid reforming member such as the particle filter adjusts the amount of foreign substances (particles, air bubbles) in the liquid to not more than a permissible value.

The fine temperature adjusting unit 175 is arranged between the rough temperature adjusting unit 171 and the supply tube 13, more specifically, between the filter 174 and the supply tube 13, and adjusts the temperature of the liquid LQ with high accuracy or precision. For example, the fine temperature adjusting unit 175 finely adjusts the temperature (temperature stability and temperature uniformity) of the liquid LQ fed from the filter 174 at an accuracy as high as ±0.01° C. to ±0.001° C. with respect to a target temperature. In this embodiment, among the plurality of units or devices constructing the temperature adjusting device 17, the fine temperature adjusting unit 175 is arranged at a position most closely to the substrate P which is an object to be supplied with the liquid LQ. Accordingly, the liquid LQ which is highly accurately adjusted in temperature can be supplied to the surface of the substrate P.

It is preferable that the filter 174 is arranged between the rough temperature adjusting unit 171 and the fine temperature adjusting unit 175 in the temperature adjusting device 17. However, the filter 174 may be arranged at another position in the temperature adjusting device 17, or arranged outside the temperature adjusting device 17.

As described above, each of the water purifying unit 161, the ultrapure water-producing unit 162, the degassing unit 173, the filter 174, and the like has a liquid reforming member and a liquid reforming unit, and functions as an adjusting unit for adjusting at least one of the property and the components of the liquid LQ. These units 161, 162, 173, 174 and the like are provided in the liquid supply mechanism 10 at predetermined positions, respectively, in the flow channel in which the liquid LQ flows. In this embodiment, one liquid supply unit 11 is arranged (see FIG. 1) for one exposure apparatus EX. However, the construction is not limited to that as described above, and it is also possible that a plurality of exposure apparatuses EX share one liquid supply unit 11. This reduces the area occupied by the liquid supply unit 11 (footprint). Alternatively, it is also possible that the water purifying system 16 and the temperature adjusting device 17 constructing the liquid supply unit 11 are divided and the water purifying system 16 is shared by a plurality of exposure apparatuses EX and the temperature adjusting device 17 may be provided for each of the exposure apparatuses EX. This reduces the footprint and enables temperature control for each of the exposure apparatuses EX. Furthermore, in the case described above, by arranging the liquid supply unit 11 or water purifying system 16, shared by a plurality of exposure apparatuses EX, on a floor (for example, under floor) different from the floor on which the exposure apparatuses EX are placed (installed), the space of the clean room in which the exposure apparatuses EX are installed can be more effectively utilized.

Next, the measuring unit 60 will be explained with reference to FIG. 5. The measuring unit 60 measures at least one of the property and the components of the liquid LQ filled in a space between the projection optical system PL and an object arranged on the side of the image plane of the projection optical system PL. As described above, since the liquid LQ in this embodiment is water, at least one of the property and components of the liquid LQ will be arbitrarily referred to as "water quality" in the following explanation.

The measuring unit 60 is provided at an intermediate position in the recovery tube 23, and measures the liquid LQ recovered by the liquid recovery mechanism 20. The liquid recovery mechanism 20 recovers the liquid LQ, filled in the space between the projection optical system PL and the object, through the recovery ports 22 of the nozzle member 70. Accordingly, the measuring unit 60 measures the water quality (at least one of the property and the components) of the liquid LQ which has been recovered through the recovery ports 22 of the nozzle member 70 and is flowing in the recovery tube 23, that is, the liquid LQ filled in the space between the projection optical system PL and the object.

As explained with reference to FIG. 3, the liquid immersion area LR of the liquid LQ is movable between the surface of the substrate stage ST1 and the surface of the measuring stage ST2. When the water quality of the liquid LQ is measured with the measuring unit 60, the control unit CONT supplies and recovers the liquid LQ by using the liquid immersion mechanism 1 in a state that the projection optical system PL is made to face or to be opposite to the measuring stage ST2, and fills the optical path space K1 between the projection optical system PL and the measuring stage ST2 with the liquid LQ. More specifically, when the water quality of the liquid LQ is measured with the measuring unit 60, the control unit CONT fills the liquid LQ in the space between the projection optical system PL and the predetermined area 100 of the upper surface 97 of the measuring stage ST2. The measuring unit 60 measures the water quality of the liquid LQ filled in the space between the projection optical system PL and the predetermined area 100 of the measuring stage ST2.

As explained above, the predetermined area 100 of the measuring stage ST2 is formed so as not to pollute the liquid LQ. Therefore, the measuring unit 60 measures the liquid LQ which is filled in the space between the projection optical system PL and the predetermined area 100 and is prevented from being polluted. Therefore, the measuring unit 60 can accurately measure the true water quality of the liquid LQ filled in the optical path space K1 on the side of the image plane of the projection optical system PL (liquid LQ supplied to the optical path space K1). The result of measurement by the measuring unit 60 is outputted to the control unit CONT. The control unit CONT can judge whether the state (water quality) of the liquid LQ filled in the space between the projection optical system PL and the predetermined area 100 of the measuring stage ST2 is in a desired state based on the result of measurement by the measuring unit 60.

For example, a consideration is given to a case in which the liquid LQ is filled in a space between the projection optical system PL and a member which may generate a pollutant, and in which measuring unit 60 measures the liquid LQ. The member which may generate a pollutant includes a member (upper surface of stage) which has not been subjected to the above-described surface treatment (PFA treatment, or the like), or a substrate P or the like coated with a photosensitive material. In this case, even when it is judged that the liquid LQ has been polluted based on the result of measurement by the measuring unit 60, it is difficult to identify the cause of the pollution (defect or trouble) of the liquid LQ. Namely, in this case, possible causes of the pollution (defect) of the liquid LQ are at least two of a failure of the water purifying system 161 of the liquid supply unit 11 and an influence from a pollutant generated from the member. In this case, it is difficult to identify the cause of the pollution (defect) of the liquid LQ based on the result of measurement by the measuring unit 60. When the cause of pollution (defect) of the liquid LQ cannot be identified, it is difficult to take a measure for eliminating the defect or take a measure for making the liquid LQ to be in a desired state (clean state). In this embodiment, the liquid LQ is measured by forming the liquid immersion area LR of the liquid LQ on the predetermined area 100 formed so as not to pollute the liquid LQ. Accordingly, the control unit CONT can accurately obtain the true state (water quality) of the liquid LQ based on the result of measurement by the measuring unit 60, and when the control unit judges that the measured liquid LQ is polluted, it can judge that the cause of the pollution is, for example, a failure of the water purifying unit 161 of the liquid supply unit 11. Therefore, for example, when performing maintenance of the water purifying unit 161, a proper measure (countermeasure) for making the liquid LQ to be in a desired state can be taken.

Consequently, the measurement process by the optical measuring instruments 300, 400, 500, and 600, and the exposure process of the substrate P are performed via the polluted liquid LQ, and thus the measurement accuracy and the exposure accuracy via the liquid LQ degrades.

In this embodiment, since water is used as the liquid LQ, PFA treatment is performed for the predetermined area 100. However, when the liquid LQ is a liquid other than water, there is a possibility that foreign substance or substances are eluted (mixed) into the liquid LQ from the predetermined area 100. In this case, as described above, a treatment which prevents pollution of the liquid is performed for the measuring stage ST2, according to the property (kind) of the liquid to be used.

Items concerning the property and components (water quality or liquid quality, or the state of the liquid) of the liquid LQ to be measured by the measuring unit 60 are determined by considering the influences thereof on the exposure accuracy and measurement accuracy of the exposure apparatus EX, or influences on the exposure apparatus EX itself. Table 1 indicates an example of items concerning the property and components of the liquid LQ and the influences thereof on the exposure accuracy of the exposure apparatus EX or the influences thereof on the exposure apparatus EX itself. As shown in Table 1, the items of the property and components of the liquid LQ include physical properties such as specific resistance; metal ions; total organic carbon (TOC); particles/bubbles; an inclusion such as bacteria (foreign substance or pollutant); dissolved gases such as dissolved oxygen (DO), dissolved nitrogen (DN); and the like. On the other hand, the items concerning the influences on the exposure accuracy of the exposure apparatus. EX or the influences on the exposure apparatus EX itself include fogging of a lens (especially, the optical element LS1); watermark (adhesion remaining as a result of solidification of an impurity in the liquid due to the evaporation of the liquid LQ); degradation of optical property due to a change in refractive index or light scattering; influence on resist process (resist pattern formation); rusting of the respective members; and the like. Table 1 summarizes these to indicate which of the items of property or components influences how much and on which performance, and in Table 1, items expected to have grave influences are marked by a "◯"

(circle). The items of the property and components of the liquid LQ to be measured by the measuring unit 60 are selected as appropriate from Table 1 based on the influences thereof on the exposure accuracy and measurement accuracy of the exposure apparatus EX and the influences thereof on the exposure apparatus EX itself. It is allowable that all of the items are measured, and that items concerning the property, and that components not shown in Table 1 may be measured.

branched tube 61K and flows into the TOC meter 61. The TOC meter 61 measures total organic carbon (TOC) in the liquid LQ flowing in the branched flow channel formed by the branched tube 61K. Similarly, the particle counter 62, the dissolved oxygen meter 63, and the specific resistance meter 64 are connected to branched tubes 62K, 63K, and 64K, respectively, branched from the recovery tube 23 at intermediate positions thereof, and measures foreign substances (par-

TABLE 1

| | | Influence | | | | | |
|---|---|---|---|---|---|---|---|
| | | Lens fogging | Watermark | Optical property | Drainage pollution | Resist process | Rusting |
| Property and components of liquid | Specific resistance | | o | o | o | o | o |
| | Metal ion | | o | | o | o | |
| | Total organic carbon (TOC) | | o | o | o | o | |
| | Particles/bubbles | | o | o | o | o | |
| | Bacteria | | o | o | o | o | |
| | Dissolved oxygen (DO) | | o | | o | o | |
| | Dissolved nitrogen (DN) | | | | o | | |
| | Silica | | o | | o | o | |
| | Organic Si | o | o | | o | o | |
| | Negative ion | | o | o | o | o | o |
| | Siloxane series, CxHy series | o | o | o | o | o | |
| | Phthalate ester | o | o | o | o | o | |
| | Cl | | o | o | o | o | o |
| | PO$_4$, SO$_4$, NO$x$ (PAG) | | o | o | o | o | o |
| | Ammonia, amines | o | o | o | o | o | |
| | Base resin | o | o | o | o | o | |
| | Carboxylic acids (lactic acid, acetic acid, formic acid) | | o | o | o | o | o |

For measuring the items selected from the above-described viewpoints, the measuring unit 60 has a plurality of measuring instruments. For example, the measuring unit 60 can include, as the measuring instruments, a specific resistance meter for measuring the specific resistance, a TOC meter for measuring the total organic carbon, a particle counter for measuring foreign substances including particles and bubbles, a DO meter for measuring dissolved oxygen (dissolved oxygen concentration), a DN meter for measuring dissolved nitrogen (dissolved nitrogen concentration), a silica meter for measuring silica concentration, an analyzer capable of analyzing the kinds and amounts of bacteria, and the like. In this embodiment, total organic carbon, particles/bubbles, dissolved oxygen, specific resistance are selected as an example of measuring items, and as shown in FIG. 5, the measuring unit 60 includes a TOC meter 61 for measuring total organic carbon, a particle counter 62 for measuring foreign substances including particles and bubbles, and a dissolved oxygen meter (DO meter) 63 for measuring dissolved oxygen, and a specific resistance meter 64.

Figure 5:
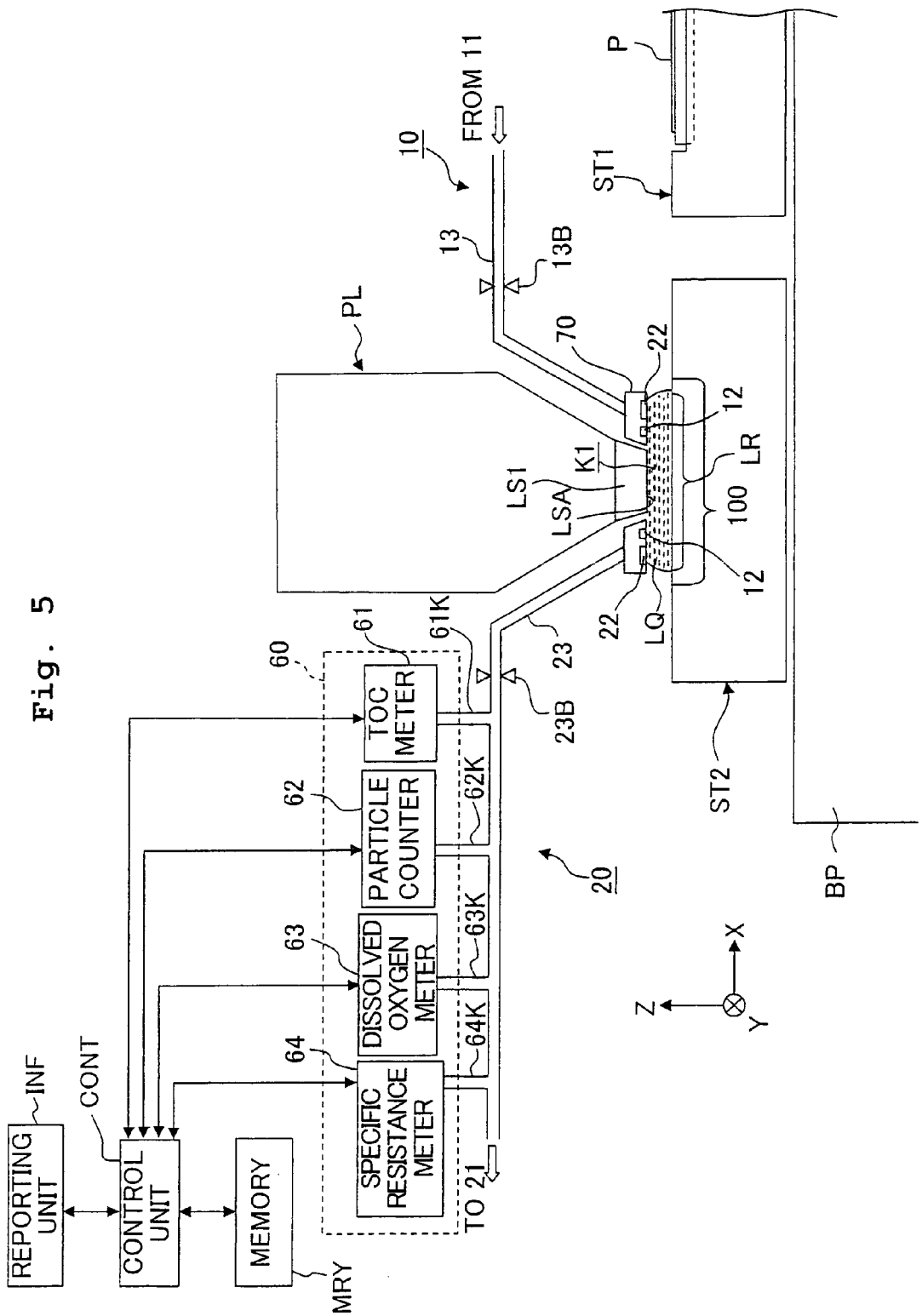
FIG. 5 is a schematic arrangement view showing a measuring unit.

As shown in FIG. 5, the TOC meter 61 is connected to a branched tube (branched flow channel) 61K branched from the recovery tube (recovery flow channel) 23 connected to the recovery ports 22, at an intermediate portion of the recovery tube 23. In the recovery tube 23, the liquid LQ recovered through the recovery ports 22 flows. The liquid LQ flowing in the recovery tube 23 is the liquid filled in the space between the projection optical system PL and the predetermined area 100 of the measuring stage ST2. A part of the liquid LQ flowing in the recovery tube 23 is recovered by the liquid recovery unit 21, and the remaining part flows through the ticles or bubbles), dissolved oxygen, and specific resistance, respectively, in the liquid LQ flowing in branched flow channels formed by the branched tubes 62K, 63K, and 64K. The silica meter and bacteria analyzer are also connectable to the branched tubes branched from the recovery tube 23 at an intermediate portion thereof.

As described above, since the measuring items of the measuring unit 60 can be selected as appropriate, the measuring unit 60 can include any one or a plurality of the measuring instruments 61 to 64.

In this embodiment, the branched tubes 61K to 64K form branched flow channels independent from each other, and to each of the branched flow channels independent from each other, one of the measuring instruments 61 to 64 is connected. Namely, the plurality of measuring instruments 61 to 64 are connected parallel to the recovery tube 23 via the branched tubes 61K to 64K, respectively. Depending on the constructions of the measuring instruments, it is also allowable that, for example, a plurality of measuring instruments are connected in series to the recovery tube 23 so that the liquid LQ branched from the recovery tube 23 is measured by a first measuring instrument, and the liquid LQ that has passed through the first measuring instrument is measured by a second measuring instrument. Depending on the number and position of the branched tubes (branched points), the possibility that foreign substances (particles) are generated is high. Accordingly, the number and positions of the branched tubes are set by considering the possibility of generation of foreign substances.

A sampling position for sampling a part of the liquid LQ may be set at an intermediate position in the recovery tube 23.

For example, to identify the kinds of the metal ions contained or present in the liquid LQ, it is possible to sample the liquid LQ to identify the kinds of the metal ions by using an analyzer provided separately from the exposure apparatus EX. This makes it possible to take a proper measure according to the identified metal ions. In addition, to measure impurities contained in the liquid LQ, it is also possible to sample the liquid LQ to measure the amount of total evaporated residue in the liquid LQ by a total evaporated residue meter provided separately from the exposure apparatus EX.

In this embodiment, the measuring unit 60 measures the water quality of the liquid LQ flowing in the branched flow channels branched from the recovery flow channel formed by the recovery tube 23, at the intermediate positions in the recovery flow channel. Since this makes it possible that the liquid LQ is always supplied to the measuring unit 60, the control unit CONT can satisfactorily measure the water quality of the liquid LQ by performing the same operations as in the liquid immersion exposure operation, that is, a liquid supply operation through the supply ports 12 and the liquid recovery operation through the recovery ports 22 without executing special operations.

Figure 6:
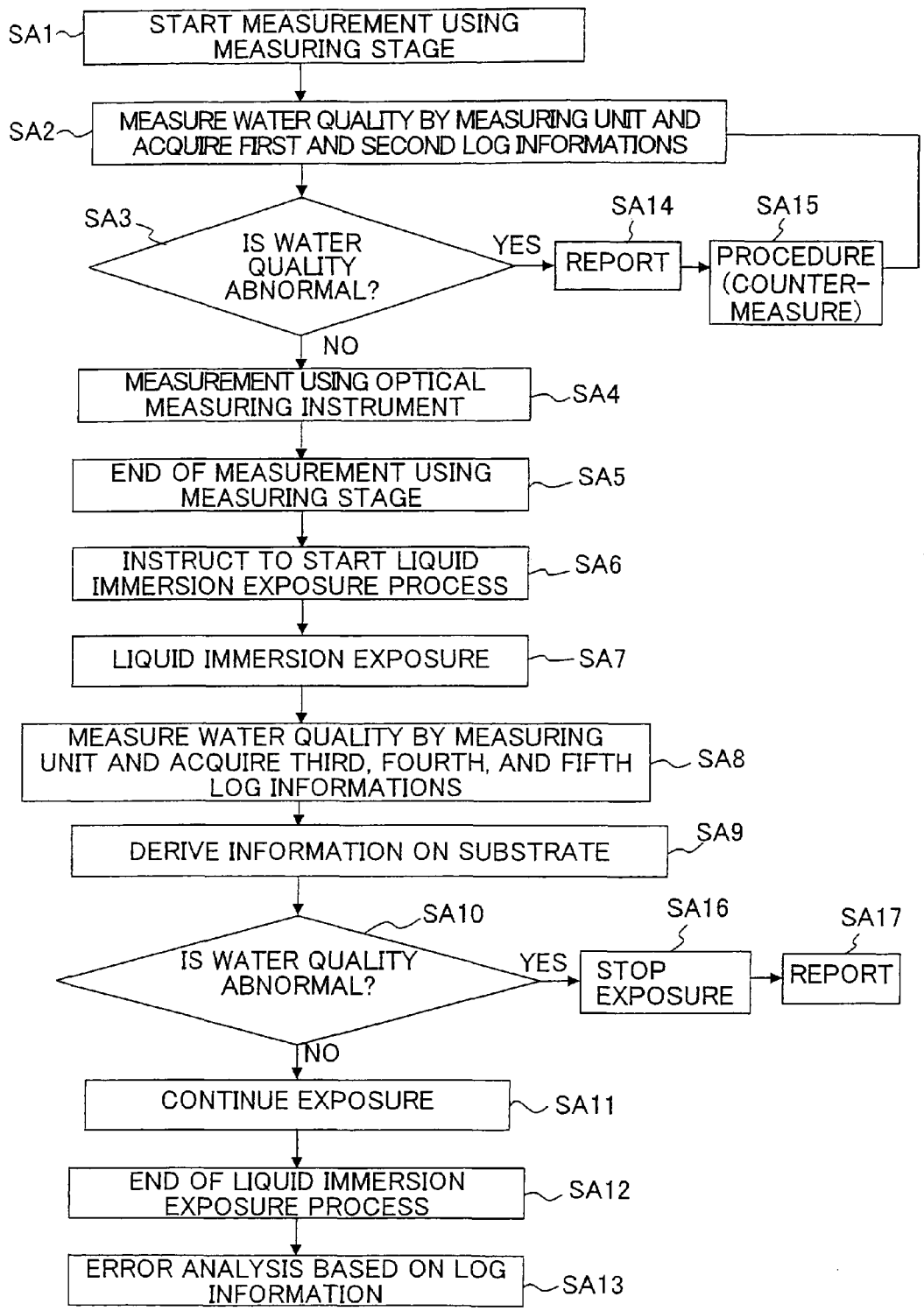
FIG. 6 is a flowchart explaining an example of an exposure sequence.

Next, a method for exposing the image of the pattern of the mask M on the substrate P by using the exposure apparatus EX constructed as described above will be explained with reference to the flowchart of FIG. 6. In this embodiment, a plurality of substrates P are successively exposed. More specifically, the plurality of substrates P are managed by lot, and the exposure apparatus EX performs exposure for each of the lots in order.

The control unit. CONT moves the substrate stage ST1 to a predetermined substrate exchange position by using the substrate stage driving unit SD1. At the substrate exchange position, by a conveyance system that is not shown, operations for unloading a substrate P after being exposed from the substrate stage ST1 and loading a substrate P before being exposed are performed. Of course, when no substrate P after being exposed is present on the substrate stage ST1, any unloading of a substrate P is not performed, and only loading of a substrate P before being exposed is performed. There are cases in which, at the substrate exchange position, only the unloading of a substrate P after being exposed is performed and the loading of a substrate P before being exposed is not performed. In the following explanation, an operation for performing, at least one of the loading of a substrate P before being exposed to the substrate stage ST1 and the unloading of a substrate P after being exposed from the substrate stage ST1, is referred to as "substrate exchange operation" as appropriate.

In this embodiment, during the substrate exchange operation on the substrate stage ST1, a measurement process using the measuring stage ST2 is performed. The control unit CONT starts a predetermined measurement process using the measuring stage ST2 while performing at least a part of the substrate exchange operation on the substrate stage ST1 (Step SA1).

The control unit CONT supplies and recovers the liquid LQ by using the liquid immersion mechanism 1 in a state that the lower surface LSA of the projection optical system PL is made to face or to be opposite to the predetermined area 100 of the upper surface 97 of the measuring stage ST2, that is, the predetermined area 100 is arranged at a position at which the substrate P is set for exposure, and fills the liquid LQ in a space between the projection optical system PL and the predetermined area 100 of the measuring stage ST2. Then, the control unit CONT measures the water quality of the liquid LQ in the space between the projection optical system PL and the predetermined area 100 of the measuring stage ST2 by using the measuring unit 60. As described above, the measuring unit 60 measures the liquid LQ of which pollution is suppressed. The result of measurement by the measuring unit 60 is outputted to the control unit CONT. The control unit CONT stores the result of measurement made by the measuring unit 60 in the memory MRY (Step SA2).

In this embodiment, the control unit CONT stores the result of measurement of the liquid LQ arranged on the predetermined area 100, performed by the measuring unit 60, in the memory MRY by associating the result with elapse of time. For example, by providing a valve sensor capable of detecting whether the valve 13B closes the flow channel of the supply tube 13, and by providing the control unit CONT with a timer function, the control unit CONT can measure the elapsed time from the time of detection that the valve 13B opened the flow channel of the supply tube 13, that is, the elapsed time from the start of the supply of the liquid LQ by the liquid supply mechanism 10. Accordingly, the control unit CONT can store the result of measurement made by the measuring unit 60 in the memory MRY by associating the result with the elapse of time by defining the time of start of the supply of the liquid LQ, to the side of the image plane of the projection optical system PL by the liquid supply mechanism 10, as a measurement start point (reference). The control unit CONT sets the time when the control unit CONT detects the valve 13B closed the flow channel 13. Namely, the control unit CONT sets the time, when the supply of the liquid LQ to the side of the image plane of the projection optical system PL by the liquid supply mechanism 10 is stopped, as the measurement start point (reference). In the following explanation, information on the result of measurement, by the measuring unit 60, of water quality of the liquid LQ filled in the space between the projection optical system PL and the predetermined area 100 of the measuring stage ST2, which is stored by being associated with elapse of time, will be referred to as "first log information" as appropriate.

In this embodiment, during a substrate exchange operation on the substrate stage ST1 after a plurality of substrates P have been successively exposed, a liquid immersion area LR of the liquid LQ is formed on the predetermined area 100 on the measuring stage ST2, and a measuring operation for the liquid LQ is performed by the measuring unit 60. The measurement process for the liquid LQ by the measuring unit 60 is performed every exchange of the substrate P on the substrate stage ST1, or every exposure process of a predetermined number of substrates P, or for each lot of the substrates P. When a plurality of substrates P are successively exposed, the control unit CONT stores the results of measurements by the measuring unit 60 in the memory. MRY by associating the results with substrates P. In the following explanation, when a plurality of substrates P are successively exposed, information on the results of measurements made by the measuring unit 60 about water quality of the liquid LQ filled in the space between the projection optical system PL and the predetermined area 100 of the measuring stage ST2, which is stored by being associated with the substrates P, is referred to as "second log information" as appropriate.

The control unit CONT can indicate (inform) the results of measurements made by the measuring unit 60 by the reporting unit INF including a display device.

The control unit CONT judges whether or not the results of measurements by the measuring unit 60 are abnormal (step SA3). The control unit CONT controls the operations of the exposure apparatus EX based on the result of judgment.

Abnormal results of measurements made by the measuring unit 60 include a situation that the state of the liquid LQ (water quality) is not in a desired state but is abnormal, a measured value of each of the respective items (TOC, foreign substance, dissolved gas concentration, silica concentration, bacteria, specific resistance, and the like) measured by the measuring unit 60 is not less than a permissible value set in advance, and exposure process and measurement process through the liquid LQ cannot be performed in a desired state.

Here, in the following explanation, a permissible value concerning water quality of the liquid LQ filled in the space between the projection optical system PL and the predetermined area 100 will be referred to as "first permissible value" as appropriate. The first permissible value means a permissible value concerning water quality of the liquid LQ that is not substantially influenced by the object (herein, the predetermined area 100) arranged on the side of the image plane of the projection optical system PL.

The first permissible value can be obtained in advance by, for example, an experiment or simulation. When the measured value concerning the water quality of the liquid LQ is not more than the first permissible value, the exposure process and measurement process through the liquid LQ can be performed in a desired state.

For example, if the value of the total organic carbon in the liquid LQ is greater (abnormal) than the first permissible value (for example, 1.0 ppb), there is a possibility that the transmittance of the liquid LQ has been lowered. In this case, the measurement accuracies of the optical measuring instruments 300, 400, 500, and 600 through the liquid LQ are degraded. Alternatively, the exposure accuracy of the substrate P through the liquid LQ is degraded.

If the amount of foreign substances including particles or bubbles in the liquid LQ is greater (abnormal) than the first permissible value, there is high possibility that the measurement accuracies of the optical measuring instruments 300, 400, 500, and 600 through the liquid LQ are degraded or the pattern transferred to the substrate P through the liquid LQ becomes defective.

If the value of dissolved gases (dissolved gas concentration) including dissolved oxygen and dissolved nitrogen in the liquid LQ is greater (abnormal) than the first permissible value, for example, when the liquid LQ supplied to the substrate P through the supply ports 12 is released to the atmosphere, there is high possibility that bubbles are generated in the liquid LQ due to the dissolved gases in the liquid LQ. If bubbles are generated in the liquid LQ, similarly to the explanation given above, there is high possibility that the measurement accuracies of the optical measuring instruments 300, 400, 500, and 600 are degraded and the pattern transferred to the substrate P becomes defective.

If the amount of bacteria is great (abnormal), the liquid LQ is polluted and lowered in transmittance. Further, when the amount of bacteria is great, there is a problem or inconvenience such that the members which come into contact with the liquid LQ (the nozzle member 70, the optical element LS1, the measuring stage ST2, the substrate stage ST1, the supply tube 13, the recovery tube 23, and the like) are polluted, thereby spreading the pollution.

If the specific resistance of the liquid LQ is smaller (abnormal) than the first permissible value (for example, 18.2 MΩ·cm at 25° C.), there is a possibility that the liquid LQ contains a large amount of metal ions such as sodium ions, or the like. If the liquid immersion area LR is formed on the substrate P by the liquid LQ containing a large amount of the metal ions, there is a possibility that the metal ions in the liquid LQ infiltrate into the photosensitive material on the substrate P and adhere to the device pattern (wiring pattern) that has already been formed under the photosensitive material, thereby causing inconvenience such as a malfunction of the device.

The control unit CONT controls the operations of the exposure apparatus EX based on the first permissible value set in advance concerning the water quality of the liquid LQ and the result of measurement by the measuring unit 60.

At Step SA3, when it is judged that the result of measurement by the measuring unit 60 is not abnormal, that is, the water quality of the liquid LQ is not abnormal, the control unit CONT fills the liquid LQ in the space between the first optical element LS1 of the projection optical system PL and the upper surface 97 of the measuring stage ST2 by using the liquid immersion mechanism 1, and performs a measuring operation using at least one of the optical measuring instruments 300, 400, 500, and 600 (Step SA4). The liquid LQ filled in the space between the projection optical system PL and the upper surfaces 301, 401, 501, and 601 of the optical measuring instruments 300, 400, 500, and 600, respectively, is the liquid LQ judged (confirmed) as being in a desired state without abnormality in water quality at Step SA3. Therefore, the measurement process using the optical measuring instrument through the liquid LQ in the desired state can be satisfactorily performed.

The measuring operation using the optical measuring instrument can be exemplified by a baseline measurement. Specifically, the control unit CONT simultaneously detects the first reference mark MFM on the reference member 300 provided in the measuring stage ST2 and a corresponding mask alignment mark on the mask M by using the above-described mask alignment system, and detects the positional relationship between the first reference mark MFM and the corresponding mask alignment mark. Simultaneously, or before or after these detections, the control unit CONT detects the positional relationship between a detection reference position of the substrate alignment system and the second reference mark PFM by detecting the second reference mark PFM on the reference member 300 by the substrate alignment system. As described above, when the first reference mark MFM is measured, the liquid immersion area LR is formed on the first reference mark MFM, and the measurement process through the liquid LQ is performed. On the other hand, when the second reference mark PFM is measured, the liquid immersion area LR is not formed on the second reference mark PFM, and the measurement process is performed not through the liquid LQ. Then, the control unit CONT obtains a distance between the projection position of the pattern of the mask M by the projection optical system PL and the detection reference position of the substrate alignment system, namely, baseline information of the substrate alignment system, based on the positional relationship between the first reference mark MFM and the corresponding mask alignment mark, the positional relationship between the detection reference position of the substrate alignment system and the second reference mark PFM, and the known positional relationship between the first reference mark MFM and the second reference mark PFM.

The measuring operation using the optical measuring instrument is not limited to the above-described baseline measurement, and at least one of illuminance unevenness measurement, spatial image measurement, illuminance measurement and the like using the optical measuring instruments 400, 500, and 600 provided on the measuring stage ST2 can be performed as the measuring operation. The control unit CONT reflects the results of measurements made by the optical measuring instruments 400, 500, and 600 on a subsequent exposure process of the substrate P by performing, for example, various corrections such as calibration of the projection optical system PL. In the case of the measurement process using the optical measuring instruments 400, 500, and 600, the control unit CONT fills the liquid LQ in the space between the first optical element LS1 of the projection optical system PL and the upper surface 97 of the measuring stage ST2 to perform the measurement process through the liquid LQ.

On the other hand, at Step SA3, when the result of measurement by the measuring unit 60 is judged as abnormal, that is, water quality of the liquid LQ is judged as abnormal, the control unit CONT does not perform the measuring operation using the optical measuring instruments, and reports (informs) the result of measurement made by the measuring unit 60 by using the reporting unit INF (Step SA14). For example, the control unit CONT can indicate information on variation amounts of TOC and dissolved gas concentration in the liquid LQ with the elapse of time, by the reporting unit INF including a display device. Also, when the result of measurement by the measuring unit 60 is judged as abnormal, the control unit CONT can inform that the result of measurement is abnormal by the reporting unit in such a way that an alarm (warning) is issued by the reporting unit INF. Further, when the result of measurement by the measuring unit 60 is judged as abnormal, the control unit CONT can stop the supply of the liquid LQ by the liquid supply mechanism 10. It is also allowable to recover the liquid LQ remaining on the measuring stage ST2 by using the liquid recovery mechanism 20 including the nozzle member 70.

As described above, the liquid supply unit 11 includes a liquid reforming member, a liquid reforming unit, and a plurality of adjusting units (water purifying unit 161, ultrapure water-producing unit 162, degassing unit 173, filter 174, and the like) for adjusting the water quality of the liquid LQ. The control unit CONT can specify at least one of the plurality of adjusting units based on the result of measurement by the measuring unit 60 and report (inform) an information on the specified adjusting unit, by the reporting unit INF. For example, when the dissolved gas concentration is judged as abnormal based on the result of measurement by the DO meter or DN meter in the measuring unit 60, the control unit CONT displays (reports), by using the reporting unit INF, an indication of which contents are to urge maintenance (inspection, replacement) of, for example, the degassing filter and/or degassing pump of the degassing unit 173 among the plurality of adjusting units. When the specific resistance of the liquid LQ is judged as abnormal based on the result of measurement by the specific resistance meter in the measuring unit 60, the control unit CONT displays (reports), by using the reporting unit INF, an indication of which contents are to urge maintenance (inspection, replacement) of, for example, the ion exchange membrane of the water purifying device in the measuring unit 60 among the plurality of adjusting units. Further, based on the result of measurement by the specific resistance meter of the measuring unit 60, when it is judged that the specific resistance value of the liquid LQ is abnormal, the control unit CONT displays (reports), by using the reporting unit INF, an indication of which contents are to urge maintenance (inspection, replacement) of, for example, the ion exchange membrane of the water purifying system 16 among the plurality of adjusting units. Furthermore, when the total organic carbon in the liquid LQ is judged as abnormal based on the result of measurement by the TOC meter in the measuring unit 60, the control unit CONT displays (reports), by using the reporting unit INF, an indication of which contents are to urge maintenance (inspection, replacement) of, for example, the UV lamp of the water purifying system 16 among the plurality of adjusting units. Moreover, when the amount of foreign substances (particles, bubbles) in the liquid LQ is judged as abnormal based on the result of measurement of the particle counter in the measuring unit 60, the control unit CONT displays (reports), by using the reporting unit INF, an indication of which contents are to urge maintenance (inspection, replacement) of, for example, the filter 174 or the particle filter of the water purifying system 16 among the plurality of adjusting units. Further, when the amount of bacteria in the liquid LQ is judged as abnormal based on the result of analysis by the bacteria analyzer in the measuring unit 60, the control unit CONT displays (reports), by using the reporting unit INF, an indication of which contents are to urge maintenance (inspection, replacement) of, for example, the UV lamp of the water purifying system 16 among the plurality of adjusting units. Furthermore, when the silica concentration in the liquid LQ is judged as abnormal based on the result of measurement by the silica meter in the measuring unit 60, the control unit CONT displays (reports), by using the reporting unit INF, an indication of which contents are to urge maintenance (inspection, replacement) of, for example, the silica removing filter of the water purifying system 16 among the plurality of adjusting units.

Then, based on the information informed by the reporting unit INF, a measure for setting the water quality of the liquid LQ to a desired state, including the above-described maintenance, and the like, is taken (Step S15). After this measure is taken, the control unit CONT executes again the measuring operation for the water quality of the liquid LQ by using the measuring unit 60. Then, the measure for setting the liquid LQ to a desired state is taken until the result of measurement by the measuring unit 60 is judged as not abnormal.

When the measuring operation using at least one of the optical measuring instruments 300, 400, 500, and 600 at Step SA4 is completed, the measuring operation using the measuring stage ST2 is ended or completed (Step SA5). Then, the control unit CONT instructs the start of the liquid immersion exposure process for the substrate P (Step SA6).

At this time, the substrate exchange operation at the substrate exchange position has been completed, and the substrate P before being exposed is held on the substrate stage ST1. The control unit CONT brings, for example, the measuring stage ST2 and the substrate stage ST1 into contact with (or in proximity to) each other, and while maintaining their relative positional relationship, moves these stages ST1 and ST2 in the XY plane to perform an alignment process with respect to the substrate P before the substrate P is exposed. At this point, a plurality of shot areas are provided on the substrate P, and alignment marks are provided corresponding to the shot areas respectively. The control unit CONT detects the alignment marks on the substrate P before the substrate P is exposed by the substrate alignment system, and calculates the position coordinates with respect to the detection reference positions of the substrate alignment system in the plurality of short areas on the substrate P.

The control unit CONT simultaneously moves the substrate stage ST1 and the measuring stage ST2 in the −Y direction by using the stage driving units SD1 and SD2 while maintaining the relative positional relationship between the substrate stage ST1 and the measuring stage ST2 in the Y axis direction. As explained with reference to FIG. 3, the control unit CONT moves the substrate stage ST1 and the measuring stage ST2 together in the −Y direction in an area including a position immediately below or under the projection optical system PL in a state that the stages ST1 and ST2 are in contact with (or in proximity to) each other. By moving the substrate stage ST1 and the measuring stage ST2 together, the control unit CONT moves the liquid, LQ retained in the space between the first optical element LS1 of the projection optical system LS1 and the upper surface 97 of the measuring stage ST2, from the upper surface 97 of the measuring stage ST2 to the upper surface 95 of the substrate stage ST1. The liquid immersion area LR of the liquid LQ filled in the space between the first optical element LS1 of the projection optical system PL and the measuring stage ST2 moves to the upper surface 97 of the measuring stage ST2, the upper surface 95 of the substrate stage ST1, and the upper surface of the substrate P in this order accompanying with the movement of the measuring stage ST2 and the substrate stage ST1 in the −Y direction. When the substrate stage ST1 and the measuring stage ST2 move together by a predetermined distance in the −Y direction, the liquid LQ is filled in a space between the first optical element LS1 of the projection optical system PL and the substrate P. Namely, the liquid immersion area LR of the liquid LQ is arranged on the substrate P in the substrate stage ST1. After moving the substrate stage ST1 (substrate P) to the position below or under the projection optical system PL, the control unit CONT withdraws the measuring stage ST2 to a predetermined position at which the measuring stage ST2 does not collide with the substrate stage ST1.

Then, the control unit CONT performs liquid immersion exposure in the step-and-scan manner for the substrate P supported on the substrate stage ST1 in a state that the substrate stage ST1 and the measuring stage ST2 are separated from each other. When performing the liquid immersion exposure for the substrate P, the control unit CONT forms the liquid immersion area LR of the liquid LQ on the substrate P by filling, the optical path space K1 for an exposure light beam LE between the projection optical system PL and the substrate P, with the liquid LQ by the liquid immersion mechanism 1, and the control unit CONT exposes the substrate P by irradiating the surface of the substrate P with the exposure light beam EL via the projection optical system PL and the liquid LQ (Step SA7). The liquid LQ filled in the optical path space K1 between the projection optical system PL and the substrate P is a liquid LQ judged (confirmed) as being in a desired state without abnormality in water quality at Step SA3. Therefore, the substrate P can be satisfactorily exposed through the liquid LQ in the desired state.

The control unit CONT executes the liquid immersion exposure operation in the step-and-scan manner for the substrate P to transfer the pattern of the mask M to each of the plurality of shot areas on the substrate P. The movement of the substrate stage ST1 for exposure of the respective shot areas on the substrate P is performed based on the position coordinates of the plurality of shot areas on the substrate P and the baseline information obtained as a result of the above-described substrate alignment.

Figure 7:
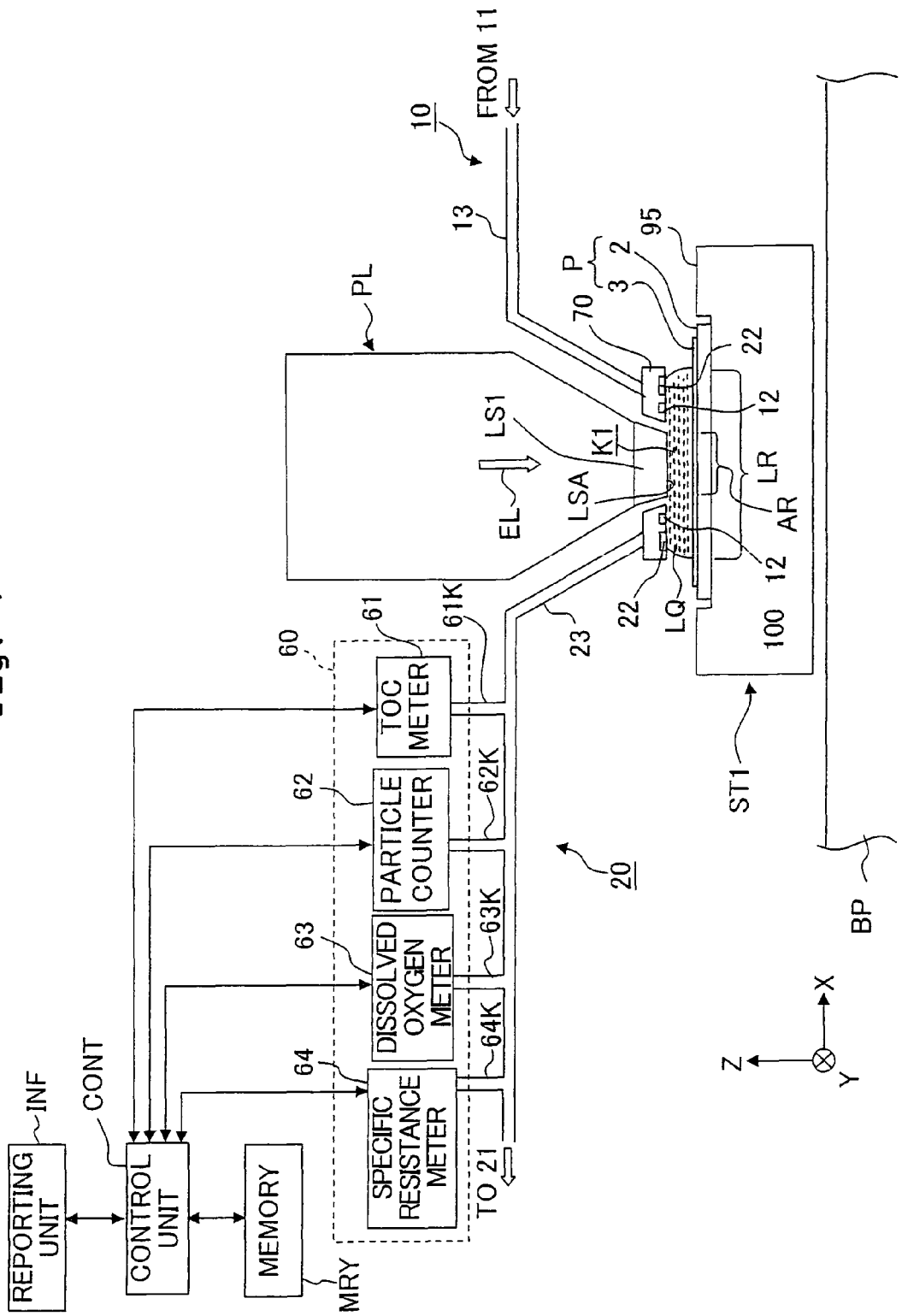
FIG. 7 is a drawing showing a state that a liquid on a substrate is measured.

FIG. 7 is a drawing showing a state in which liquid immersion exposure is being performed for the substrate P. During the liquid immersion exposure, the liquid LQ in the liquid immersion area LR is in contact with the substrate P, and information on the water quality of the liquid LQ recovered from the surface of the substrate P by the liquid recovery mechanism 20 is always measured (monitored) by the measuring unit 60. The result of measurement by the measuring unit 60 is outputted to the control unit CONT. The control unit CONT stores the result of measurement (monitor information) by the measuring unit 60 in the memory MRY (Step SA8).

The control unit CONT stores the result of measurement of the liquid LQ, arranged on the substrate P, by the measuring unit 60 in the memory MRY by associating the result with the elapse of time. For example, the control unit CONT stores the result of measurement by the measuring unit 60 in the memory MRY by associating the result with the elapse of time by defining the time when the liquid immersion area LR moves from the surface of the measuring stage ST2 to the surface of the substrate stage ST1 (surface of the substrate P) as a measurement start point (reference). In the following explanation, the result of measurement by the measuring unit 60 concerning water quality of the liquid LQ, filled in the space between the projection optical system PL and the substrate P on the substrate stage ST1, which is stored by being associated with the elapse of time, will be referred to as "third log information" as appropriate.

In this embodiment, a plurality of substrates P are successively exposed. When a plurality of substrates P are successively exposed, the control unit CONT stores the results of measurements by the measuring unit 60 by associating the results with the substrates P. In the following explanation, when a plurality of substrates P are successively exposed, information on the results of measurements by the measuring unit 60 concerning water quality of the liquid LQ, filled in the space between the projection optical system PL and the substrate P on the substrate stage ST1, which is stored by being associated with the substrates P will be referred to as "fourth log information" as appropriate.

The control unit CONT stores the results of measurements by the measuring unit 60 in the memory MRY by associating the results with shot areas to be exposed. The control unit CONT obtains positional information of a shot area among the shot area in a coordinate system defined by the laser interferometer 94 for measuring the position of the substrate stage ST1 based on, for example, an output of the laser interferometer 94; and the control unit CONT stores the result of measurement measured by the measuring unit 60 when the exposure is being performed for the short area, of which positional information has been obtained in the memory MRY, by associating the result with the shot area. Between a point of time when the liquid LQ is measured by the measuring unit 60 and a point of time when this measured liquid LQ is arranged on the substrate P (on the shot area), there is a time lag corresponding to a distance between the recovery tube 22 and the sampling port (branched tube) of the measuring unit 60. Therefore, the information to be stored in the memory MRY may be corrected by considering the distance. In the following explanation, information on the result of measurement by the measuring unit 60 stored by being associated with the shot area is referred to as "fifth log information" as appropriate.

The control unit CONT obtains information on the substrate P, as explained below, based on the result of measurement of the liquid LQ filled in the space between the projection optical system PL and the predetermined area 100 of the measuring stage ST2 measured by the measuring unit 60 at Step SA2 and based on the result of measurement of the liquid LQ filled in the space between the projection optical system PL and the substrate P measured by the measuring unit 60 at Step SA8 (Step SA9).

Figure 8:
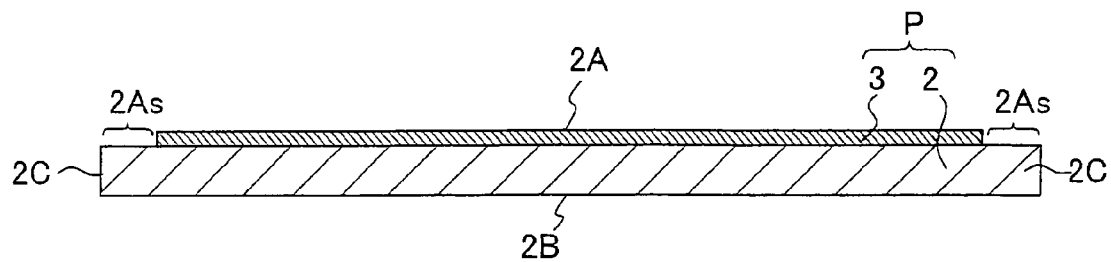
FIG. 8 is a drawing showing an example of the substrate.

FIG. 8 is a drawing showing an example of the substrate P. In FIG. 8, the substrate P has a base material 2 and a photosensitive material 3 coated on a part of an upper surface 2A of the base material 2. The base material 2 includes, for example, a silicon wafer (semiconductor wafer). The photosensitive material 3 is coated by a predetermined thickness (for example, about 200 nm) on the area occupying most of the central portion of the upper surface 2A of the base material 2. On the other hand, the photosensitive material 3 is not coated on a peripheral portion 2As of the upper surface 2A of the base material 2, and the base material 2 is exposed at the peripheral portion 2As of the upper surface 2A. Although side surfaces 2C and a lower surface (back face) 2B of the base material 2 are not coated with the photosensitive material 3, the side surfaces 2C and/or the lower surface 2B, or the peripheral portion 2As may be coated with the photosensitive material 3. In this embodiment, a chemically amplified resist is used as the photosensitive material 3.

When the substrate P and the liquid LQ of the liquid immersion area LR come into contact with each other, a part of the components of the substrate P is eluted into the liquid LQ. As described above, the photosensitive material 3 of this embodiment is a chemically amplified resist, and this chemically amplified resist is formed by containing a base resin, a photo acid generator (PAG) contained in the base resin, and an amine-based substance called a quencher. When the liquid LQ comes into contact with such a photosensitive material 3, a part of the components of the photosensitive material 3, more specifically, PAG and/or amine-based substances are eluted into the liquid LQ. Also when the peripheral portion 2As of the base material 2 and the liquid LQ come into contact with each other, depending on the substances forming the base material 2, there is a possibility that a part of the components (silicon) of the base material 2 is eluted into the liquid LQ. In the following explanation, a substance or substances (PAG, amine-based substances, silicon, and/or the like) eluted from the substrate P into the liquid LQ will be referred to as "eluted substance" as appropriate.

The liquid LQ measured by the measuring unit 60 at Step SA8 is a liquid LQ filled in the space between the projection optical system PL and the substrate P, and is the liquid LQ after being brought into contact with the substrate P. Therefore, the liquid LQ measured by the measuring unit 60 contains eluted substances eluted from the substrate P into the liquid LQ. On the other hand, the liquid LQ measured by the measuring unit 60 at Step SA2 is a liquid LQ suppressed from being polluted, namely, a liquid LQ which contains no eluted substances. Therefore, by comparing the result of measurement at Step SA2 and the result of measurement at Step SA8, the control unit CONT can obtain information on the eluted substances eluted from the substrate P into the liquid LQ as information on the substrate P. The above-described third, fourth, and fifth log information include the information on the eluted substances eluted from the substrate P into the liquid LQ.

Information on the eluted substances eluted from the substrate P into the liquid LQ includes various kinds of information such as the amount and properties (kinds) of the eluted substances. The control unit CONT can obtain the amount of the eluted substances, eluted from the substrate P into the liquid LQ, based on the result of measurement concerning water quality by the measuring unit 60 at Step SA2 and based on the result of measurement concerning water quality by the measuring unit 60 at Step SA8.

For example, the control unit CONT can obtain, in particular, the amount of an eluted substance eluted from the photosensitive material 3 among the eluted substances eluted from the substrate P, based on the result of measurement by the TOC meter 61 in the measuring unit 60. Alternatively, by providing a measuring instrument capable of measuring the concentration of eluted substances in the liquid LQ, the amount of the eluted substances (concentration of the eluted substances in the liquid LQ) can be measured. Therefore, the control unit CONT can obtain the amount of eluted substances eluted from the substrate P into the liquid LQ, based on the difference between the amount of the eluted substances measured at Step SA2 and the amount of the eluted substances measured at Step SA8.

As the measuring unit 60, by providing a measuring instrument capable of measuring the kinds of the eluted substances (photosensitive material 3, PAG, and the like) eluted from the substrate P, the kinds of the eluted substances can be identified.

Thus, the control unit CONT can obtain information on the substrate P such as the amount of eluted substances and the kind of the photosensitive material 3 based on the result of measurement by the measuring unit 60.

In this embodiment, the relationship between the substrate conditions and the amount of eluted substances into the liquid LQ are obtained in advance, and this relationship is stored in advance in the memory MRY. Here, the substrate conditions include conditions concerning the photosensitive material 3 such as the kind (property) of the photosensitive material 3 and conditions concerning the base material such as the property (kind) of the base material 2, information whether or not the peripheral portion 2As is formed (whether or not the base material 2 and the liquid LQ come into contact with other), and the like. The substrate conditions also include coating conditions such as the film thickness of the photosensitive material 3 when the photosensitive material 3 is coated on the base material 2.

In this embodiment, a plurality of substrates P (lots) having mutually different substrate conditions are successively exposed, and information on amounts of eluted substances corresponding to the plurality of substrates P (lots) are stored in the memory MRY. Since the amount of eluted substances into the liquid LQ changes according to the substrate conditions (properties and film thickness of the photosensitive material 3, and the like), the relationship between the substrate conditions and the amount of eluted substances into the liquid LQ can be obtained in advance by, for example, an experiment and simulation.

Therefore, when the measured value (amount of eluted substances) measured by the measuring unit 60 when a substrate P with predetermined substrate conditions is subjected to liquid immersion exposure is greatly different from the amount of eluted substances according to the predetermined substrate conditions stored in the memory MRY (when the result of measurement by the measuring unit 60 is abnormal), the control unit CONT judges that the substrate P is abnormal and can control the exposure operation.

When information on the substrate P held on the substrate stage ST1 is unknown, the information on the substrate P such as the kind and coating conditions of the photosensitive material 3 on the substrate P to be measured can be estimated based on the result of measurement by the measuring unit 60 (for example, the TOC meter 61) and the information stored in the memory MRY (the relationship between the substrate conditions and the amount of eluted substances eluted into the liquid LQ).

Figure 9:
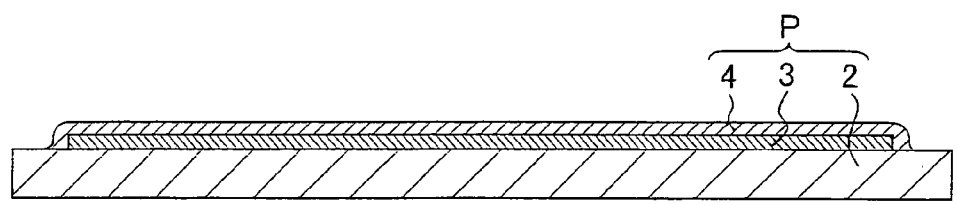
FIG. 9 is a drawing showing another example of the substrate.

As shown in FIG. 9, when the photosensitive material 3 is covered by a thin film 4, the amount of eluted substances measured by the measuring unit 60 is small. Here, the thin film 4 covering the photosensitive material 3 is an antireflection film (top ARC), a topcoat film (protective film), or the like. In some cases, the thin film 4 is a topcoat film covering an antireflection film formed on the photosensitive material 3. The topcoat film protects the photosensitive material 3 from the liquid LQ, and is made of, for example, a fluorine-based liquid-repellent material. By providing the thin film 4, even when the substrate P and the liquid LQ come into contact with each other, the elution of substance from the photosensitive material 3 into the liquid LQ is suppressed. Therefore, when the photosensitive material 3 is covered by the thin film 4, the difference between the result of measurement (amount of eluted substances) at Step SA2 and the result of measurement (amount of eluted substances) at Step SA8 becomes smaller than in the case where the photosensitive material 3 is not covered by the thin film 4. Therefore, the control unit CONT can also judge whether or not the photosensitive material 3 is covered by the thin film 4 based on the result of measurement by the measuring unit 60. Thus, the control unit CONT is also capable of judging the presence or absence of the thin film 4 as information on the substrate P, based on the result of measurement by the measuring unit 60.

Depending on the substance forming the thin film 4, there is a possibility that a predetermined substance of the photosensitive material 3 is eluted into the liquid via the thin film 4, or a substance of the material forming the thin film 4 is eluted into the liquid. Therefore, information on the substrate P obtained based on the result of measurement by the measuring unit 60 includes information on the material (substance) of the thin film 4 in addition to the presence or absence of the thin film 4 on the photosensitive material 3.

In this embodiment, the substrate conditions and exposure conditions are set to be optimum so that the amount of eluted substances to be eluted from the substrate P into the liquid LQ (concentration of the eluted substances in the liquid LQ) becomes not more than a predetermined permissible value. The exposure conditions mentioned herein include conditions of the liquid LQ, and include the property (kind) of the liquid LQ, the supply amount of the liquid LQ per unit time, the temperature of the liquid LQ, the flow rate of the liquid LQ on the substrate P, and a liquid contact time during which the substrate P and the liquid LQ are in contact with each other, and the like. When the amount of eluted substances eluted into the liquid LQ (concentration of the eluted substances in the liquid LQ) is not more than the permissible value, the substrate P can be satisfactorily exposed.

In the following explanation, the permissible value concerning the water quality of the liquid LQ filled in the space between the projection optical system PL and the substrate P will be referred to as "second permissible value" as appropriate. The second permissible value means a permissible value concerning water quality of the liquid LQ influenced by the object (herein the substrate P) arranged on the side of the image plane of the projection optical system PL.

Information on the second permissible value concerning the eluted amount can be obtained in advance through, for example, an experiment or simulation. When the amount of eluted substances eluted from the substrate P into the liquid LQ is not less than the second permissible value, there is a possibility that the concentration of the eluted substances in the liquid LQ becomes high and the transmittance of the liquid LQ lowers, thereby degrading the exposure accuracy through the liquid LQ such that the exposure light beam EL cannot satisfactorily reach the surface of the substrate P through the liquid LQ. Further, when the amount of eluted substances eluted from the substrate P into the liquid LQ is not less than the second permissible value, there is a possibility that a member (nozzle member 70, recovery tube 23, first optical element LS1, and the like) which comes into contact with the liquid LQ is polluted, the eluted substances adheres again to the surface of the substrate P and act as foreign substances, and an adhesion mark (watermark) is formed. In this embodiment, by reducing the amount of eluted substances eluted from the substrate P into the liquid LQ to not more than the second permissible value, the above-described problem can be suppressed.

In this embodiment, substrates P (lots) having mutually different substrate conditions are successively exposed, and in the memory MRY, a plurality of pieces of information on the second permissible value each corresponding to one of the substrates P (lots) is stored in advance. In other words, information on the second permissible value is stored in advance in the memory MRY for each of the substrates P (for each of the lots). For example, in a case that substrates P (lots) having a first photosensitive material and a second photosensitive material of which properties are different from each other, respectively, are successively exposed, even when the amount (concentration) of eluted substances from the first photosensitive material into the liquid LQ and the amount (concentration) of eluted substances from the second photosensitive material into the liquid LQ are the same, due to the properties (absorbance index, and the like) of the eluted substances, there is a possibility that a situation arises that the liquid containing the eluted substances from the second photosensitive material does not have a desired transmittance, whereas the liquid containing the eluted substances from the first photosensitive material has the desired transmittance. Therefore, in this embodiment, the second permissible value is obtained in advance corresponding to each of the plurality of substrates P (lots), and informations on the second permissible value are stored in advance in the memory MRY. Thus, in this embodiment, the second permissible value of the amount of eluted substances is obtained in advance individually for each of the substrate (for each of the lots), and is stored in the memory MRY.

To reduce the amount of eluted substances eluted from the substrate P into the liquid LQ (concentration of the eluted substances in the liquid LQ) to be not more than the second permissible value determined in advance, a predetermined treatment may be performed in advance, before forming the liquid immersion area LR on the substrate P, for suppressing the amount of eluted substances from the substrate P into the liquid LQ in the liquid immersion area LR, such as performing the immersion of the substrate P in the liquid LQ which does not form the liquid immersion area LR. Alternatively, by providing the thin film 4 as shown in FIG. 9, the elution of the substances from the photosensitive material 3 into the liquid LQ can be suppressed. Accordingly, it is possible to suppress the adhesion of foreign substance to the substrate P and the formation of adhesion mark, or the pollution of the member (nozzle member 70, recovery tube 23, and the like) which comes into contact with the liquid LQ.

The control unit CONT judges whether or not the result of measurement by the measuring unit 60 is abnormal (Step SA10). Namely, the control unit CONT judges whether or not the measured value (amount of eluted substances) measured by the measuring unit 60 is not less than the second permissible value based on the second permissible value concerning the eluted substances determined in advance, and based on the result of measurement by the measuring unit 60. Then, the control unit CONT controls the exposure operation based on the result of judgment.

When it is judged at Step SA10 that the result of measurement by the measuring unit 60 is not abnormal, that is, when the result of measurement (amount of eluted substances) by the measuring unit 60 is not more than the second permissible value concerning the eluted substances determined in advance, the control unit CONT continues the liquid immersion exposure operation (Step SA11). At this time, the control unit CONT can inform the result of measurement (monitor information) by the measuring unit 60 by the reporting unit INF.

After completing the liquid immersion exposure for the substrate P on the substrate stage ST1 (Step SA12), the control unit CONT moves the measuring stage ST2 by using the measuring stage driving unit ST2, and brings the measuring stage ST2 into contact with (or proximity to) the substrate stage ST1. Then, the control unit CONT moves the liquid immersion area LR of the liquid LQ from the upper surface 95 of the substrate stage ST1 to the upper surface 97 of the measuring stage ST2. After moving the liquid immersion area LR of the liquid LQ to the surface of the measuring stage ST2, the control unit CONT moves the substrate stage ST1 to the substrate exchange position. At the substrate exchange position, the substrate P after being exposed is unloaded from the substrate stage ST1, and a substrate P before being exposed is loaded to the substrate stage ST1. Then, exposure process is performed for this substrate P before being exposed.

Then, the control unit CONT successively exposes a plurality of substrates P by repeating the above-described sequence. In the memory MRY, the above-described first, second, third, fourth, and fifth log informations are accumulated and stored. By using these log informations, an exposure failure (error) can be analyzed (Step SA13).

On the other hand, when it is judged at Step SA10 that the result of measurement by the measuring unit 60 is abnormal, that is, when the result of measurement (amount of eluted substances) by the measuring unit 60 is not less than the second permissible value obtained in advance concerning the eluted substances, the control unit CONT stops the exposure operation (Step SA16). At this time, for example, the control unit CONT is capable of closing the flow channel in the supply tube 13 by driving the valve 13B provided in the supply tube 13 so as to stop the supply of the liquid LQ. After stopping the exposure operation, the liquid LQ remaining on the substrate P may be recovered by using the nozzle member 70 and the liquid recovery mechanism 20. Further, after recovering the liquid LQ remaining on the substrate P, the substrate P may be unloaded from the substrate stage ST1. By doing so, it is possible to prevent problems such as formation of a large amount of defective shots (defective substrates) which would be otherwise caused if the exposure process were continued in the abnormal state.

The control unit CONT reports, by the reporting unit INF, the result of measurement (monitor result) by the measuring unit 60 (Step SA17). For example, it is possible to indicate, by the reporting unit INF including a display device, information on the amount of eluted substance caused by the photosensitive material 3 contained in the liquid LQ, information on the amount of variation in the eluted substance with the elapse of time, and information on the amount of eluted substances contained in the liquid LQ (concentration of eluted substances in the liquid LQ) during exposure of a specific short area among the plurality of shot areas. When it is judged that the result of measurement by the measuring unit 60 is abnormal, the control unit CONT can report that the result of measurement is abnormal by using the reporting unit INF in such a way that an alarm (warning) is issued by the reporting unit INF. When an amount of eluted substances of not less than the second permissible value is measured, the control unit can inform information to urge review on the substrate conditions (for example, coating conditions of the photosensitive material 3) by using the reporting unit INF. Alternatively, concerning this substrate P, when an amount of eluted substances of not less than the second permissible value is measured, information to urge review on the exposure conditions (such as an amount of the liquid LQ to be supplied per unit time) can be informed by the reporting unit INF.

When a substance that should not be contained in the photosensitive material 3 used for the substrate P (lot) is measured, information on this measurement can be reported by the reporting unit INF. Further, when a substance that should not be contained in the photosensitive material 3 used for the substrate P (lot) is measured, information to urge inspection of the photosensitive material 3 can be reported by the reporting unit INF. Furthermore, when an amount of eluted substances is not less than the permissible value although the thin film 4 should have been coated, information to urge an inspection as to whether or not the thin film 4 is coated, and when it is coated, whether or not the coating is satisfactory, can be reported by the reporting unit INF.

Alternatively, during the exposure of the substrate P, information on the amounts of variation in TOC and dissolved gas concentration in the liquid LQ with the elapse of time, and information on the TOC and dissolved gas concentration in the liquid LQ during exposure of a specific shot area among the plurality of shot areas can be indicated by the reporting unit INF including a display device.

Even when it is judged at Step SA10 that abnormality has occurred in the liquid LQ, the control unit CONT can continue the exposure operation. Then, for example, during exposure of a specific shot area, when the result of measurement by the TOC meter 61 of the measuring unit 60 is judged as abnormal, the control unit CONT stores information that, the result of measurement of TOC is abnormal, in the memory MRY as fifth log information by associating the result with this shot area. Then, after exposing all of the shot areas, the control unit CONT can take a measure, based on the fifth log information stored in the memory MRY, such that a shot area, of which pattern transfer accuracy may have been degraded due to the abnormality in the result of measurement (the amount of eluted substances is not less than the permissible value), is removed or prevented from being exposed when the next overlaying exposure is performed. When this shot area is inspected and no abnormality is found in the formed pattern, this shot area is not removed and the device formation using this shot area is continued. Alternatively, the control unit CONT may inform that the result of measurement by the TOC meter 61 is abnormal by associating the result with the shot area. Thus, in addition to indication of the result of measurement made by the measuring unit 60 as monitor information in real time by the reporting unit INF, the control unit CONT can also indicate log information by the reporting unit INF.

In this embodiment, at Step SA3, when the measured value (water quality) of each of the items measured by the measuring unit 60 is not less than the first permissible value set in advance, the control unit CONT judges that the result of measurement by the measuring unit 60 is abnormal (abnormal water quality). The first permissible value of water quality can be properly determined according to the exposure process executed after the measuring operation by the measuring unit 60. For example, after the measuring operation (Step SA2) by the measuring unit 60, the measuring operation using the optical-measuring instruments 300, 400, 500, and 600 is performed (Step SA4), and according to target measurement accuracies of the optical measuring instruments 300, 400, 500, and 600, the first permissible value of water quality of the liquid LQ can be properly set. Specifically, in the case of exposing a plurality of lots (substrates P), when the optical measuring operation using the optical measuring instruments 300, 400, 500, and 600 is performed before exposing the lots (substrates P) and high measurement accuracies are required for the first lot (first substrates), the first permissible value concerning water quality of the liquid LQ when measuring the first lot (first substrates) through the liquid LQ is set to be strict. When comparatively rough measurement accuracies are permitted for the second lot (second substrates) different from the first lot (first substrates), the first permissible value concerning water quality of the liquid LQ when measuring the second lot (second substrates) through the liquid LQ can be set to be comparatively lax.

Alternatively, the second permissible value concerning water quality of the liquid LQ can be properly set according to the target exposure accuracy (target pattern transfer accuracy) for the substrate P. Specifically, in the case of exposing a plurality of lots (substrates P), when high exposure accuracy (pattern transfer accuracy) is required for the first lot (first substrates), the second permissible value concerning water quality of the liquid LQ when exposing the first lot (first substrates) through the liquid LQ is set to be strict. On the other hand, when comparatively rough exposure accuracy (pattern transfer accuracy) is permitted for the second lot (second substrates) different from the first lot (first substrates), the second permissible value concerning water quality of the liquid LQ when exposing the second lot (second substrates) through the liquid LQ can be set to be comparatively lax.

By doing so, desired exposure accuracies and measurement accuracies for the respective first and second lots (first and second substrates) can be obtained, and working ratio of the exposure apparatus EX can also be prevented from lowering. Namely, when the first and second permissible values concerning water quality for the first lot and the first and second permissible values concerning water quality for the second lot are set to the same values, the water quality which is more than necessary is required for the second lot. In this case, even when desired water quality is obtained for the second lot, if the result of measurement by the measuring unit 60 is not less than the first permissible value or the second permissible value, the measuring operation or exposure operation is stopped as described above. Thus, the operation of the exposure apparatus EX is stopped although desired water quality has been obtained, thereby lowering the working ratio of the exposure apparatus EX. However, by properly setting the permissible values concerning water quality of the liquid LQ according to the target exposure accuracy and the like as described above, it is possible to prevent the problem such as lowering in working ratio of the exposure apparatus EX.

As described above, by providing the measuring unit 60 which measures at least one of the property and the components of the liquid LQ filled in a space between the projection optical system PL and the predetermined area 100 of the measuring stage ST2, it is possible to accurately judge, based on the result of measurement, whether the liquid LQ filled in the optical path space K1 is in a desired state or not (abnormal or not). Then, when the result of measurement by the measuring unit 60 is abnormal, by taking a proper measure for setting the liquid LQ to the desired state, the exposure accuracy of the substrate P through the liquid LQ and the measurement accuracy of the optical measuring instrument through the liquid LQ can be prevented from degrading.

In this embodiment, the result of measurement of the liquid LQ arranged on the predetermined area 100 measured by the measuring unit 60 is stored as the first and second log informations in the memory MRY, and the result of measurement of the liquid LQ arranged on the substrate P measured by the measuring unit 60 is stored as the third, fourth, and fifth log informations in the memory MRY. For example, based on the first and second log information, maintenance (inspection, replacement) of each of the adjusting units (liquid reforming member and liquid reforming unit) constructing the liquid supply unit 11 can be performed in optimal timing. Also based on the first and second log information, the frequency of inspection and replacement can be set to be optimum according to each of the adjusting units. For example, from the first log information, when the measured value (amount of foreign substances) of the particle counter worsens with the elapse of time, an optimal replacement time (replacement frequency) of the particle filter can be estimated and set based on the degree of change in the measured value with the elapse of time. Further, from the first and second log informations, performance of the particle filter used can be set to be optimal. For example, when the measured value of the particle counter rapidly worsens with the elapse of time, a high-performance particle filter is used, and when the measured value of the particle counter does not greatly change, a comparatively low (inexpensive) particle filter can be used so as to reduce the cost. By managing the exposure apparatus EX based on the first and second log informations in this manner, it is possible to prevent a problem such that excessive (unnecessary) maintenance is performed and the working ratio is lowered, or that the maintenance is neglected and the liquid LQ in a desired state cannot be supplied.

Since the first log information is water quality information associated with elapse of time, the point of time at which the water quality starts degrading can be specified. Therefore, the cause of exposure failure can be analyzed by associating the cause with the elapse of time. Similarly, also by using the second log information, a failure (error) such as an exposure failure can be analyzed. When the substrate P is inspected in an inspection process as a post-process after the substrate P is exposed, by comparing and analyzing the result of inspection and the first and second log informations, the cause of the failure can be analyzed and identified.

It is not necessarily indispensable that both of the first log information and the second log information are acquired. Instead, one of the first and second log informations may be acquired.

Since the third log information is water quality information associated with elapse of time, the amount of variation of the eluted substances with the elapse of time can be obtained based on the third log information. When the amount of variation greatly increases with the elapse of time, it can be judged that the photosensitive material 3 is soluble into the liquid LQ. When many exposure failures (pattern failures) occur in a specific lot or a specific shot area, the fourth log information (or fifth log information) is referred to, and when the measured value of the TOC meter when exposing this lot (or shot area) is abnormal, it can be analyzed that the cause of the pattern failures is the eluted substances. For example, based on the fourth log information, a procedure or action, such as a selective inspection of the substrate P exposed when the result of measurement by the measuring unit 60 is abnormal, can be taken after finishing the exposure. Further, based on the fifth log information, when the liquid LQ is judged as abnormal during exposure of a specific shot area, the control unit CONT can take a procedure or action to remove this specific shot area, not to expose this shot area in the next overlaying exposure, or the like. Alternatively, the control unit CONT can also instruct an inspection unit, which performs an inspection process, to perform an inspection of the specific shot area in greater detail than usual. By analyzing the correlation between pattern failures and eluted substances based on the third, fourth, and fifth log informations in this manner, the cause of the failures (pattern failures) can be identified. Then, based on the result of analysis, a procedure or action, such as review on the substrate conditions and/or exposure conditions, can be taken so as to prevent the pattern failures.

It is not necessarily indispensable that the third, fourth, and fifth log informations are acquired. Instead, one or a plurality of the third, fourth, and fifth log informations can be omitted.

The control unit CONT can control the exposure operation and measuring operation based on the result of measurement by the measuring unit 60. For example, as described above, before exposing the substrate P, a radiation amount (illuminance) of the exposure light beam EL is measured with the optical measuring instrument 600 (Step SA4), and based on the result of measurement, the radiation amount (illuminance) of the exposure light beam EL is set (corrected) to be optimal, and then the exposure operation is started. However, for example, during exposure of the substrate P, due to TOC variation in the liquid LQ, the light transmittance of the liquid LQ may vary. When the light transmittance of the liquid LQ varies, the exposure amount (totalized exposure amount) on the substrate P varies, and as a result, a problem may occur such as fluctuation in exposure line width of the device pattern formed in the shot areas. Therefore, the relationship between the TOC in the liquid LQ and the transmittance of the liquid LQ is obtained and stored in the memory MRY in advance, and by controlling the exposure amount based on the stored information and the result of measurement by the measuring unit 60 (TOC meter 61), the control unit CONT can prevent the above-described problems. Namely, the control unit CONT derives a transmittance corresponding to the TOC variation in the liquid LQ based on the stored information, and controls the exposure amount reaching the substrate P to be uniform. By controlling the exposure amount on the substrate P according to the change in TOC measured by the TOC meter 61, the exposure amount becomes uniform in a substrate (among shots) or among substrates, thereby making it possible to suppress the fluctuation of exposure line width. The relationship between the TOC and light transmittance of the liquid LQ can be obtained by the measurement process using the optical measuring instrument 600 through the liquid LQ. In this embodiment, since a laser is used as a light source of the exposure light beam EL, the exposure amount on the substrate P can be controlled by using a method in which energy (light amount) per 1 pulse is controlled, or the pulse number is controlled, or the like. Alternatively, the exposure amount on the substrate P can also be controlled by controlling the scanning rate of the substrate P.

The control unit CONT can control the exposure operation and the measuring operation based on the first log information. For example, when it is judged, based on the first log information, that the TOC value is worsening with elapse of time, the exposure apparatus EX makes the exposure amount to be uniform among substrates P and reduces fluctuation in the exposure line width by controlling the exposure amount according to the elapse of time, based on the value (amount of change) according to the elapse of time of the TOC stored as the first log information.

As shown in FIG. 1, in the exposure apparatus EX, the liquid supply mechanism 10 includes a functional fluid supply unit 120. The control unit CONT is capable of supplying a functional fluid LK from the functional fluid supply unit 120 of the liquid supply mechanism 10 to each of the members which come into contact with the liquid LQ forming the liquid immersion area LR, based on the first log information or the result of measurement by the measuring unit 60, so as to clean the members. For example, when the liquid LQ is not in a desired state and is polluted, namely, for example, the liquid LQ contains a large number of bacteria, there is a possibility that the members which come into contact with the liquid LQ, more specifically, the lower surface 70A of the nozzle member 70, the internal flow channel of the nozzle member 70, the supply tube 13 connected to the nozzle member 70, the recovery tube 23, the lower surface LSA of the first optical element LS1, the upper surface 95 of the substrate stage ST1, and the upper surface 97 of the measuring stage ST2 (including each of the upper surfaces of the optical measuring instruments 300, 400, 500, and 600, and the predetermined area 100), and the like is polluted. If each of the members is polluted, even when a clean liquid LQ is supplied from the liquid supply unit 11, the liquid LQ is polluted due to contact with the members; and if the liquid immersion area LR is formed by the polluted liquid LQ, the exposure accuracy and measurement accuracy through the liquid LQ are degraded.

In addition, when the liquid immersion area LR of the liquid LQ is formed on the substrate P, the liquid LQ contains an eluted substance such as PAG eluted from the substrate P. Therefore, to the nozzle member 70 which comes into contact with this liquid LQ containing the eluted substance, a pollutant derived from the eluted substance easily adheres to the nozzle member 70, and in particular, the pollutant easily adheres to a portion in the vicinity of the recovery ports 22 of the nozzle member 70. When a mesoporous member or body is provided on the recovery ports 22, the pollutant also adheres to the mesoporous member or body. Then, if the nozzle member 70 and/or the mesoporous member or body are left in the state that the pollutant is adhered thereto, even when a clean liquid LQ is supplied to the optical path space K1, the supplied liquid LQ is polluted due to contact with the polluted nozzle member 70, and the like.

Therefore, the control unit CONT judges whether or not the members which come into contact with the liquid LQ are to be cleaned, based on the result of measurement by the measuring unit 60. Namely, at Step SA3, when the control unit judges that the measured value is greater than the first permissible value (or second permissible value, or permissible value for cleaning), based on the result of measurement by the measuring unit 60, then the control unit CONT cleans each of the members by supplying a functional fluid LK having a cleaning effect (or sterilization effect) to each of to the members from the functional fluid supply unit (cleaning unit) 120 which constructs a part of the liquid supply mechanism 10.

When supplying the functional fluid LK from the functional fluid supply unit 120, the control unit CONT makes the lower surface LSA of the projection optical system PL to face or to be opposite to the upper surface 97 of the measuring stage ST2 or the upper surface 95 of the substrate stage ST1. Alternatively, a dummy substrate DP as described later may be held on the substrate stage ST1 to face or to be opposite to the lower surface LSA of the projection optical system PL.

When cleaning the respective members, the control unit CONT opens the flow channel in the supply tube 19 by driving the second valve 19B provided in the supply tube 19 which connects the functional fluid supply unit 120 and the liquid supply unit 11, and closes the flow channel in the return tube 18 by the first valve 18B. Accordingly, the functional fluid LK is supplied from the functional fluid supply unit 120 to the liquid supply unit 11. The functional fluid LK supplied from the functional fluid supply unit 120 flows through the liquid supply unit 11 and then flows through the supply tube 13 and the internal flow channel (supply flow channel) of the nozzle member 70, and is supplied to the side of the image plane of the projection optical system PL through the supply ports 12. When the functional fluid supply unit 120 supplies the functional fluid LK, similarly to when the liquid immersion exposure operation is performed, the liquid recovery mechanism 20 performs a liquid recovery operation. Therefore, the functional fluid LK filled on the side of the image plane of the projection optical system PL is recovered through the recovery ports 22 and flows through the recovery tube 23, and is then recovered by the liquid recovery unit 21. The functional fluid LK flows through the flow channels (supply tube 13, recovery tube 23, nozzle member 70, and the like) of the liquid immersion mechanism 1 to clean these flow channels.

Since the functional fluid LK filled on the side of the image plane of the projection optical system PL also comes into contact with the lower surface (liquid contact surface) LSA of the first optical element LS1 and the lower surface (liquid contact surface) 70A of the nozzle member 70, the functional fluid LK cleans the lower surfaces LSA and 70A. Further, in a state that the immersion area of the functional fluid LK is formed, it is possible to clean a wide area in the upper surface 97 of the measuring stage ST2 or in the upper surface 95 of the substrate stage PT1 by two-dimensionally moving the measuring stage ST2 (or substrate stage ST1) in the XY direction with respect to the immersion area of the functional fluid LK. Thus, by performing the operation for forming the immersion area of the functional fluid LK by the same procedures as in the case of the liquid immersion exposure operation, each of the members can be simultaneously and efficiently cleaned.

As cleaning procedure by using the functional fluid LK, after the functional fluid LK is supplied from the functional fluid supply unit 120, the operations for supplying and recovering the functional fluid LK are continued for a predetermined period of time, by the same procedures as in the case of the liquid immersion exposure operation, so as to form the liquid immersion area of the functional fluid LK on the side of the image plane of the projection optical system PL. It is also allowable that the functional fluid LK is heated and then fed into the flow channels in the liquid supply mechanism 10 and the liquid recovery mechanism 20. After a predetermined period of time has been elapsed, the operations for supplying and recovering the functional fluid LK are stopped. In this state, the functional fluid LK is retained on the side of the image plane of the projection optical system PL, and is in an immersion state. After maintaining the immersion state for a predetermined period of time, the control unit CONT performs the operations for supplying and recovering pure water for a predetermined period of time by the liquid supply mechanism 10 and the liquid recovery mechanism 20 to form a liquid immersion area of pure water on the side of the image plane of the projection optical system PL. Accordingly, the pure water flows through the flow channels of the liquid supply mechanism 10 and the liquid recovery mechanism 20, and the flow channels are cleaned by the pure water. In addition, by the immersion area of the pure water, the lower surface LSA of the first optical element LS1 and the lower surface 70A of the nozzle member 70 are also cleaned.

After completing the cleaning process, the control unit CONT fills the liquid LQ in the space between the projection optical system PL and the predetermined area 100 of the measuring stage ST2 by using the liquid immersion mechanism 1, and is capable of confirming whether or not the cleaning process was satisfactorily performed, namely, whether or not the liquid LQ is in a desired state, by measuring the liquid LQ by using the measuring unit 60.

It is preferable that the functional fluid LK is composed of a material having no influence on each of the members. In this embodiment, hydrogen peroxide is used as the functional fluid LK. Among the members, a member made of a material having no resistance against the functional fluid LK may be removed before the cleaning process using the functional fluid LK.

In this embodiment, it is described that the cleaning process is performed by controlling the operations of the liquid supply mechanism 10 including the functional fluid supply unit 120 based on the result of measurement by the measuring unit 60. However, as a matter of course, it is also allowable that the cleaning process is performed at predetermined time intervals (for example, monthly or yearly) without referring to the result of measurement by the measuring unit 60. As a source of pollution of the members (the nozzle member 70, the first optical element LS1, and the like) which come into contact with the liquid LQ are not only polluted liquid LQ and an eluted substance from the substrate P. There is a possibility that the members are also polluted, for example, by an impurity floating in the air and adhering to the members. In such a case also, by performing the cleaning process at predetermined time intervals without referring to the result of measurement by the measuring unit 60, the pollution of the members and the pollution of the liquid LQ which comes into contact with the members can be prevented.

In the first embodiment described above, the water quality measurement when the liquid immersion area is formed on the substrate P may be omitted. Namely, in the flowchart of FIG. 6, Steps SA9 to SA11, SA16, and SA17 may be omitted.

Second Embodiment

Next, a second embodiment will be described. In the following explanation, constitutive parts or components which are same as or equivalent to as those in the embodiment described above are designated by the same reference numerals, and any explanation therefor will be simplified or omitted.

Figure 10:
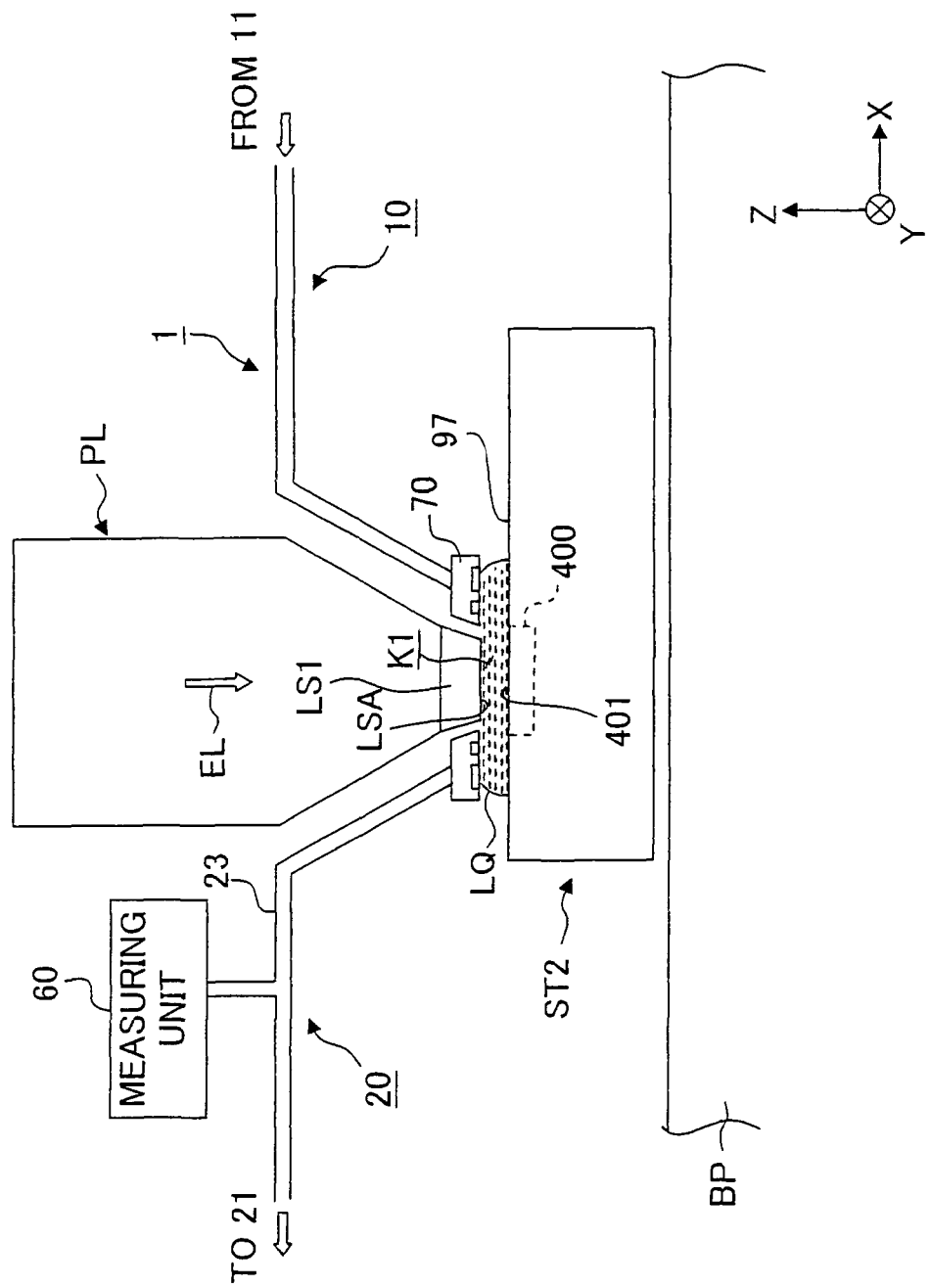
FIG. 10 is a drawing showing an exposure apparatus according to a second embodiment.

In the above-described first embodiment, the liquid LQ is filled in the space between the projection optical system PL and the predetermined area 100 of the measuring stage ST2, and in this state, the water quality of the liquid LQ is measured (Step SA2), and based on the result of measurement, when it is judged that the water quality of the liquid LQ has no abnormality (Step SA3), a measuring operation using at least one of the optical measuring instruments 300, 400, 500, and 600 is performed. In this embodiment, as shown in FIG. 10, in a state that the liquid LQ is filled in a space between the projection optical system PL and the optical measuring instrument (here, for example, the sensor 400) on the measuring stage ST2, the control unit CONT performs a measuring operation by using the sensor 400, and concurrently performs the measuring operation using the sensor 400 and at least a part of the water quality measuring operation using the measuring unit 60. Namely, the control unit CONT supplies and recovers the liquid LQ by the liquid immersion mechanism 1 in a state that the control unit CONT makes the projection optical system PL and the upper surface 401 of the sensor 400 provided on the measuring stage ST2 to face each other (to be opposite to each other). Accordingly, the liquid LQ is filled in the optical path space K1 between the projection optical system PL, the sensor 400 and the sensor 400 can perform a measurement process through the liquid LQ, and the measuring unit 60 can perform a measurement process for water quality of the liquid LQ recovered by the liquid recovery mechanism 20. As described above, the upper surface 401 of the sensor 400 is coated with, for example, "Cytop (trademark)" so as not to pollute the liquid LQ. Therefore, the measuring unit 60 can measure the liquid LQ which is suppressed from being polluted. Here, the explanation is given for an example in which the measuring operation using the sensor 400 and the measuring operation using the measuring unit 60 are concurrently performed. However, as a matter of course, it is also allowable that the measuring operations using the reference member 300 and the sensors 500, 600 and the measuring operation using the measuring unit 60 can be concurrently performed.

In this manner, by concurrently performing the measuring operation using the optical measuring instrument through the liquid LQ and the water quality measuring operation using the measuring unit 60, the measurement time using the measuring stage ST2 can be shortened and the throughput can be improved.

Third Embodiment

Figure 11:
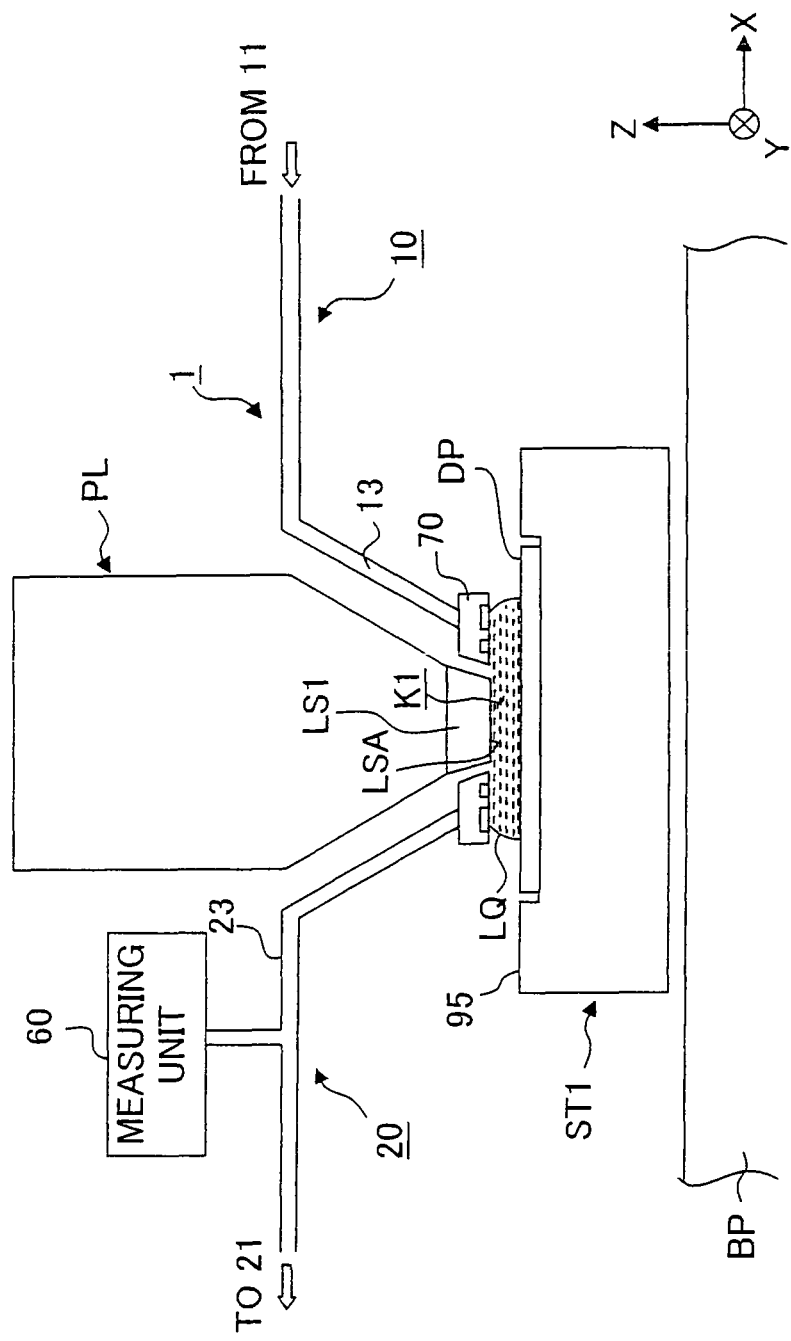
FIG. 11 is a drawing showing an exposure apparatus according to a third embodiment.

Next, a third embodiment will be explained. In the above-described embodiment, when the water quality of the liquid LQ is measured with the measuring unit 60, the control unit CONT supplies and recovers the liquid LQ by the liquid immersion mechanism 1 in a state that the projection optical system PL and the measuring stage ST2 are made to face (to be opposite to) each other, however, as shown in FIG. 11, it is also allowable that the control unit CONT supplies and recovers the liquid LQ by the liquid immersion mechanism 1 in a state that the projection optical system PL and a dummy substrate DP held on the substrate stage ST1 are made to face each other, and measures the liquid LQ in contact with the dummy substrate DP by using the measuring unit 60. The dummy substrate DP is a different member from the substrate P for device producing, and has substantially same size and shape as those of the substrate P. On the upper surface of the dummy substrate DP, at least an area which comes into contact with the liquid LQ is formed so as not to pollute the liquid LQ. In this embodiment, for the upper surface of the dummy substrate DP, PFA treatment is performed similarly to the first embodiment. Alternatively, the dummy substrate DP may be made of PFA. Also in this case, the measuring unit 60 can accurately measure the water quality of the liquid LQ without being influenced by the object (the dummy substrate DP in this case) arranged on the side of the image plane of the projection optical system PL.

Alternatively, the following construction may also be adopted in which a partial (or whole) area of the upper surface 95 of the substrate stage ST1 is formed so as not to pollute the liquid LQ by performing, for example, the PFA treatment therefor; and when measuring the water quality of the liquid LQ by using the measuring unit 60, in a state that the projection optical system PL and the upper surface 95 of the substrate stage ST1 are made to face each other (to be opposite to each other), the liquid LQ is supplied and recovered by the liquid immersion mechanism 1 and the water quality measurement is performed by the measuring unit 60.

Still alternatively, it is also allowable that, in a state that the substrate stage ST1 and a predetermined member other than the measuring stage ST2 are made to face (to be opposite to) the projection optical system PL, the liquid LQ is supplied and recovered by the liquid immersion mechanism 1, and water quality measurement using the measuring unit 60 is performed. In this case, the predetermined member has a predetermined area formed so as not to pollute the liquid LQ. This predetermined member may be provided movably, by a driving unit including an actuator, on the side of the image plane of the projection optical system PL.

Alternatively, the measuring unit 60 may be provided in the measuring stage ST2. In this case, the measuring unit 60 includes measuring instruments (TOC meter, particle counter, and the like) embedded in the measuring stage ST2, and a sampling port (hole) formed in the upper surface 97 of the measuring stage ST2. When the liquid LQ is measured by the measuring instrument, the liquid immersion area LR of the liquid LQ is formed on the side of the image plane of the projection optical system PL, the liquid immersion area LR and the measuring stage ST2 are relatively moved, the liquid immersion area LR is arranged on the sampling port, and the liquid LQ is made to flow into the sampling port. The measuring instrument measures the liquid LQ acquired via the sampling port. Here, PFA treatment or the like is performed for the upper surface 97 of the measuring stage ST2 so as not to pollute the liquid LQ. Also in this construction, the measuring unit 60 can accurately measure the water quality of the liquid LQ. Similarly, the measuring unit 60 may be provided in the substrate stage ST1.

Fourth Embodiment

Next, a fourth embodiment will be explained with reference to FIG. 12. The feature of this embodiment is that a measuring unit 60 (60A, 60B) measures water quality of the liquid LQ at a plurality (herein, two) of measuring positions in the flow channels of the liquid immersion mechanism 1.

Figure 12:
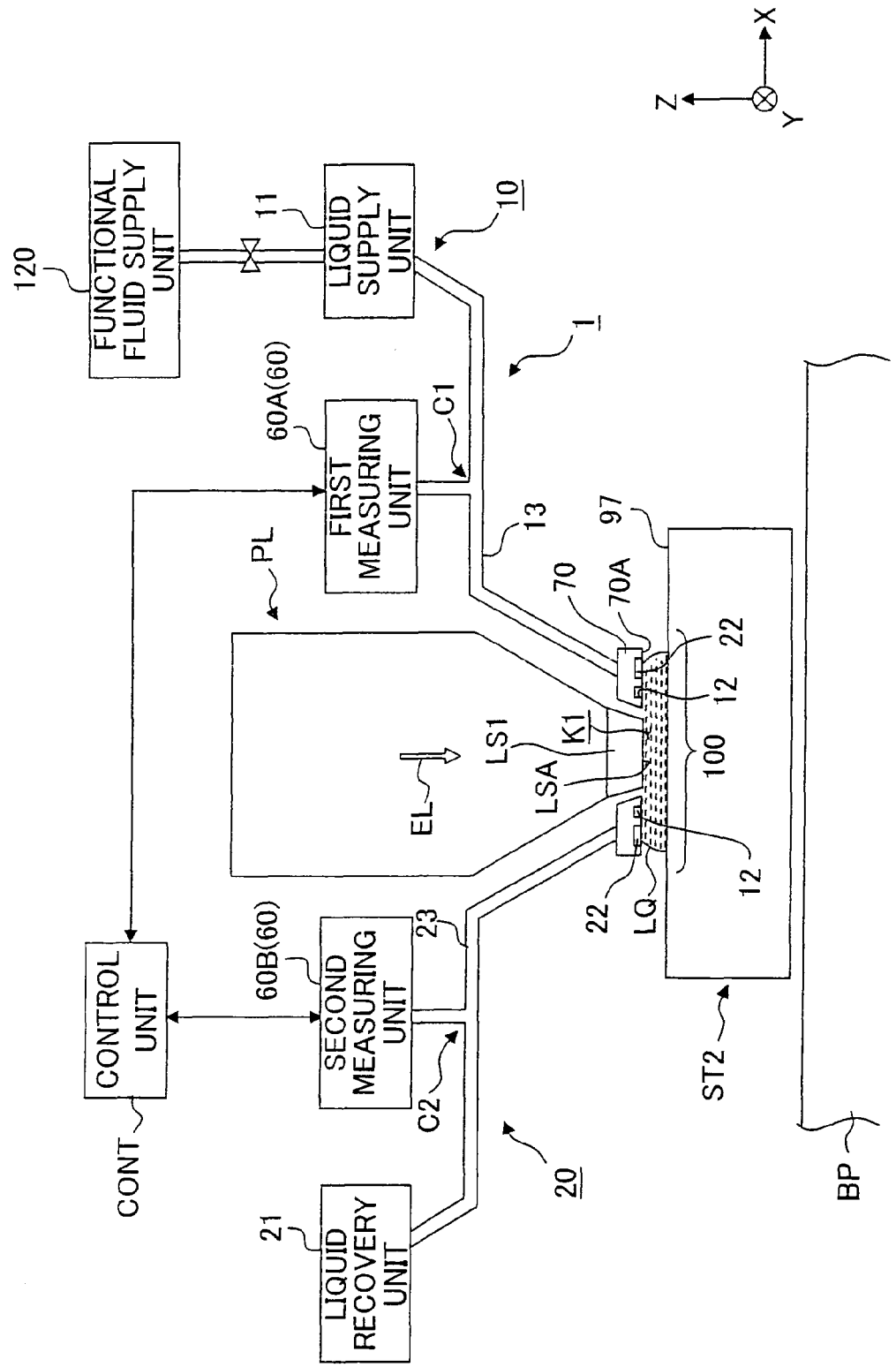
FIG. 12 is a drawing showing an exposure apparatus according to a fourth embodiment.

In FIG. 12, the liquid immersion mechanism 1 includes a supply tube 13 for supplying the liquid LQ and a recovery tube 23 for recovering the liquid LQ. The measuring unit 60 includes a first measuring unit 60A for measuring the water quality of the liquid LQ at a predetermined position (first position) C1 in the supply tube 13 and a second measuring unit 60B for measuring the water quality of the liquid LQ at a predetermined position (second position) C2 in the recovery tube 23. The first and second measuring units 60A and 60B have a construction substantially equivalent to that of the measuring unit 60 of the first embodiment explained with reference to FIG. 5. The measuring unit 60 measures the water quality of the liquid LQ at the first position C1 and the second position C2 in the flow channels, constructing the liquid immersion mechanism 1, by using the first and second measuring units 60A and 60B, respectively. The measurement results of the first and second measuring units 60A, 60B are outputted to the control unit CONT.

The control unit CONT can obtain the state of the flow channel between the first position C1 and the second position C2 in flow channels of the liquid immersion mechanism 1, based on the result of measurement by the first measuring unit 60A, namely the result of measurement of water quality of the liquid LQ at the first position C1, and on the result of measurement by the second measuring unit 60B, namely the result of measurement of water quality of the liquid LQ at the second position C2. In this embodiment, between the first position C1 and the second position C2 constructing the flow channels of the liquid immersion mechanism 1, the nozzle member 70 is provided. Therefore, the control unit CONT can obtain the state of the nozzle member 70 based on the results of measurements by the first and second measuring units 60A and 60B. Specifically, the control unit CONT can obtain the state of pollution of the flow channel between the first position C1 and the second position C2 including the nozzle member 70 based on the results of measurements by the first and second measuring units 60A and 60B.

When obtaining the pollution state of the flow channel between the first position C1 and the second position C2 by using the first and second measuring units 60A and 60B, the control unit CONT supplies and recovers the liquid LQ by the liquid immersion mechanism 1 in a state that the control unit CONT makes the lower surface LSA (lower surface 70A of the nozzle member 70) of the projection optical system PL face (to be opposite to) the predetermined area 100 of the upper surface 97 of the measuring stage ST2, and the control unit CONT fills the liquid LQ in the space between the projection optical system PL and the predetermined area 100. Accordingly, the measuring unit 60 (second measuring unit 60B) can measure the water quality of the liquid LQ without being influenced by the object arranged on the side of the image plane of the projection optical system PL, and can accurately measure the state of the flow channel between the first position C1 and the second position C2.

When the flow channel between the first position C1 and the second position C2 is polluted, the result of measurement by the first measuring unit 60A and the result of measurement by the second measuring unit 60B become different from each other. Accordingly, the control unit CONT can obtain the state of the pollution of the flow channel between the first position C1 and the second position C2 including the nozzle member 70, based on the results of measurements by the first and second measuring units 60A and 60B. When the flow channel between the first position C1 and the second position C2 is polluted, for example, when an organic matter is present inside the recovery tube 23 and/or inside the recovery flow channel (internal flow channel) of the nozzle member 70, a measured value measured by the TOC meter of the second measuring unit 60B becomes greater than a measured value measured by the TOC meter of the first measuring unit 60A. Therefore, the control unit CONT can obtain the state of pollution of the flow channel between the first position C1 and the second position C2 based on the results of measurements by the first and second measuring units 60A and 60B.

Between the first position C1 and the second position C2, the nozzle member 70 having the supply ports 12 for supplying the liquid LQ to the optical path space K1 and the recovery ports 22 for recovering the liquid LQ from the optical path space K1 is arranged, and when the flow channel between the first position C1 and the second position C2 is polluted, the liquid LQ is consequently polluted when the liquid LQ passes through this flow channel, and the polluted liquid LQ fills the optical path space K1.

Therefore, the control unit CONT judges whether or not maintenance for, in particular, the flow channel between the first position C1 and the second position C2 in the flow channels constructing the liquid immersion mechanism 1 is to be performed, according to the result of measurement by the measuring unit 60. Specifically, the control unit CONT judges whether or not the results of measurements (the difference between the measured value measured by the first measuring unit 60A and the measured value measured by the second measuring unit 60B) by the measuring unit 60 are abnormal, and based on the result of judgment, judges whether or not the maintenance is to be performed.

Here, the phrase that "the result of measurement of the measuring unit 60 is abnormal" includes a situation that a difference between the measured value measured by the first measuring unit 60A and the measured value measured by the second measuring unit 60B is not less than a predetermined permissible value; the state (water quality) of the liquid LQ is not in the desired state by passing through the flow channel between the first position C1 and the second position C2; and the exposure process and measurement process through the liquid LQ cannot be performed in a desired state when the liquid LQ fills the optical path space K1. Information on this permissible value can be obtained in advance through, for example, an experiment or simulation.

As described above, since the nozzle member 70 comes into contact with the liquid LQ containing eluted substance or substances eluted from the substrate P, the nozzle member 70 is easily polluted. If the pollution of the nozzle member 70 is left as it is, even when a clean liquid LQ is supplied into the optical path space K1, the supplied liquid LQ comes into contact with the polluted nozzle member 70 and the like, and then is polluted. In this embodiment, by providing the nozzle member 70 between the first position C1 and the second position C2, the control unit CONT can accurately obtain the state of pollution of the nozzle member 70 based on the results of measurements by the first and second measuring units 60A and 60B. Then, when the nozzle member 70 is polluted, by taking a proper procedure or action for cleaning the nozzle member 70, the liquid LQ filled in the optical path space K1 can be maintained at a desired state.

The control unit CONT can judge whether or not maintenance is to be performed, according to the results of measurements by the measuring unit 60 (first and second measuring units 60A and 60B), namely, according to the result of judgment as to whether or not the results of measurements by the measuring unit 60 (difference between the measured value measured by the first measuring unit 60A and the measured value measured by the second measuring unit 60B) are abnormal. When it judges that maintenance is to be performed for the flow channel between the first position C1 and the second position C2, the predetermined maintenance is performed. As the maintenance, similarly to the first embodiment, the functional fluid LK having a cleaning function is supplied from the functional fluid supply unit 120 into the flow channels of the liquid immersion mechanism 1, including the portion between the first position C1 and the second position C2, to clean the flow channels. Alternatively, as the maintenance, the nozzle member 70 is detached or separated from the supply tube 13 and the recovery tube 23, namely, the nozzle member 70 is removed from the exposure apparatus EX, and is cleaned by a predetermined cleaning unit separate from the exposure apparatus EX. Alternatively, the maintenance may be exemplified by replacement of the nozzle member 70 with a new one (clean one), cleaning by an operator, and the like.

After the maintenance, the control unit CONT supplies and recovers the liquid LQ by the liquid immersion mechanism 1, and can confirm whether or not the flow channel including the nozzle member 70 has become clean, by measuring the water quality of the liquid LQ at the first and second positions C1 and C2.

In this embodiment, the state of the flow channel between the first position C1 and the second position C2 including the nozzle member 70 is measured, however, as a matter of course, it is also possible to obtain the state of the flow channel between arbitrary measuring positions, in the flow channels of the liquid immersion mechanism 1, which do not include the nozzle members 70. For example, in the supply tube 13, by setting a portion in the vicinity of the position at which the supply tube 13 is connected to the liquid supply unit 11 as the first position C1, and setting a position in the vicinity of the position at which the supply tube 13 is connected to the nozzle member 70 as the second position C2, the state of the supply tube, 13 can be obtained. Based on the results of measurements by the measuring units, a procedure or action can be taken, for example, whereby the functional fluid LK is fed into the supply tube 13; the supply tube 13 is removed from the exposure apparatus EX and cleaned; the supply tube 13 is replaced with a new (clean) one; or the like.

In this embodiment, the measuring unit 60 measures the water quality of the liquid LQ at each of the two points, namely in the first and second positions C1 and C2 in the flow channels of the liquid immersion mechanism 1. However, as a matter of course, the water quality of the liquid LQ can be measured at three or more arbitrary positions in the flow channels of the liquid immersion mechanism 1. In this case, the measuring units are set or placed at a plurality of predetermined positions in the flow channels of the liquid immersion mechanism 1, and the control unit CONT can obtain the state of flow channels between the respective measuring positions, based on the results of measurements of water quality of the liquid LQ at the plurality of measuring positions.

Thus, the control unit CONT measures water quality of the liquid LQ at a plurality of measuring positions along the flow direction of the liquid LQ, in the flow channels of the liquid immersion mechanism 1, by using the measuring unit 60, and the control unit CONT obtains the state of the flow channels between the measuring positions based on the results of measurements of water quality at the respective measuring positions. Accordingly, in the flow channels constructing the liquid immersion mechanism 1, it is possible to identify a certain position at which the water quality of the liquid LQ is changed, thereby easily identifying the cause of the change. The control unit CONT can also identify a certain portion in which abnormality occurs, based on the results of measurements by the measuring units. Then, by reporting (informing) that an abnormality occurs in the certain portion by using the reporting unit INF, it is possible to urge investigation of this portion so as to quickly realize quick restoration from the failure.

Other Embodiments

The measuring unit 60 in each of the first to fourth embodiments is provided on the exposure apparatus EX in a fixed manner. However, for example, it is also allowable that the measuring unit 60 is connected to the exposure apparatus EX (supply tube 13 or recovery tube 23) at the time of maintenance of the exposure apparatus or in a predetermined timing so as to periodically or irregularly perform water quality measurement of the liquid LQ.

In each of the first to fourth embodiments, the measuring unit 60 includes a plurality of measuring instruments (61, 62, 63, and 64) and is connected to the recovery tube 23 (or the supply tube 13) via a plurality of branched tubes, respectively. However, it is also allowable that one branched tube (port) is provided for the recovery tube 23 (or the supply tube 13), and the plurality of measuring instruments (61, 62, 63, and 64) are successively connected to the two ports while exchanging the measuring instruments to be connected to the two ports to perform water quality measurement of the liquid LQ. Alternatively, in the second embodiment, the first measuring unit 60A is connected to the supply tube 13 via a branched tube, and the second measuring unit 60B is connected to the recovery tube 23 via a branched tube. However, it is also allowable to mutually connect one measuring unit, the first position C1 of the supply tube 13 and the second position C2 of the recovery tube 23, and by switching the flow channels by using valves or the like, after measuring water quality of the liquid LQ at the first position C1 (second position C2), the water quality of the liquid LQ at the second position C2 (first position C1) is measured.

In the first to fourth embodiments, when it is desired to measure the components of the bacteria in the liquid LQ, it is allowable that the liquid LQ to be supplied is sampled at a predetermined timing and measured (analyzed) by using a measuring device (analyzer) provided separately from the exposure apparatus EX. Also, when measuring particles, bubbles, dissolved oxygen and the like, it is allowable that, instead of the in-line system, the liquid LQ is sampled at a predetermined timing and measured by a measuring device provided separately from the exposure apparatus EX. Alternatively, for example, it is also allowable that the branched tubes 61K to 64K are provided with valves, and by operating the valves, the liquid LQ flowing in the supply tube 13 is made to flow into the measuring unit 60 at a predetermined timing and is intermittently measured. On the other hand, by always supplying the liquid LQ flowing in the supply tube 13 to the measuring unit 60 and by continuously measuring the liquid LQ, the measurement by the measuring unit 60 can be made stable.

In the first to fourth embodiments, the branched tubes 61K, 62K, 63K, and 64K are connected to the recovery tube 23 between the liquid recovery unit 21 and the nozzle member 70, and the measuring unit 60 measures the liquid LQ branched from the recovery tube 23. In this case, it is desired that the branched tubes are arranged at positions as near to the nozzle member 70 (near to the recovery ports 22) as possible.

In the first to fourth embodiments, the branched tubes 61K, 62K, 63K, and 64K function as sampling ports for sampling the liquid LQ flowing in the recovery tube 23, and the measuring unit 60 measures the liquid LQ sampled by the branched flow channels branched at intermediate positions in the recovery tube 23, between the nozzle member 70 and the liquid recovery unit 21. However, it is also allowable that the sampling ports are attached at positions in vicinity of, for example, the recovery ports 22 of the nozzle member 70, and that the measuring unit 60 measures the liquid LQ flowing at positions in vicinity of the recovery ports 22.

As described above, the liquid LQ used in the embodiments is pure water. Pure water is easily acquired in large quantities in a semiconductor producing factory, or the like, and has an advantage that the pure water has no harmful influence on a photoresist on the substrate P, an optical element (lens), and the like. Pure water also has no harmful influence on the environment, and has a very low content of impurities, so that the pure water is expected to have a function to wash the surface of the substrate P and the surface of the optical element provided at the end surface of the projection optical system PL. When the purity of pure water supplied from a factory or the like is low, the exposure apparatus may have an ultrapure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by $1/n$, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the optical element LS1 is provided at the end of the projection optical system PL, and by this lens, the optical property, for example, aberrations (spherical aberration, coma aberration, and the like) of the projection optical system PL can be adjusted. The optical element which is attached to the end of the projection optical system PL may be an optical plate used for adjusting the optical property of the projection optical system PL. Alternatively, the optical element may be a plane-parallel through which the exposure light beam EL is transmissive.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, instead of allowing the optical element to be exchangeable.

In the embodiment of the present invention, the space between the projection optical system PL and the surface of the substrate P is filled with the liquid LQ. However, for example, it is also allowable that the space is filled with the liquid LQ in such a state that a cover glass formed of a plane-parallel is attached to the surface of the substrate P.

In the case of the projection optical system PL concerning each of the embodiments, the optical path space, which is on the side of the image plane of the optical element arranged at the end portion, is filled with the liquid. However, it is also possible to adopt such a projection optical system in which the optical path space, on the side of the mask in relation to the optical element LS1, is also filled with the liquid, as disclosed in International Publication No. 2004/019128.

The liquid LQ is water in the embodiment of the present invention. However, the liquid LQ may be any liquid other than water. For example, when the light source of the exposure light beam EL is the $F_2$ laser, the $F_2$ laser beam is not transmissive through water. Therefore, the liquid LQ may be for example, a fluorine-based fluid such as fluorine-based oil and perfluoropolyether (PFPE) through which the $F_2$ laser beam is transmissive. In this case, the portion, which makes contact with the liquid LQ, is subjected to a liquid-attracting treatment by forming, for example, a thin film with a substance, including fluorine, which has a molecular structure with small polarity, on the portion. Alternatively, other than the above, it is also possible to use, as the liquid LQ, those (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used.

The substrate P, which is usable in the respective embodiments described above, is not limited to the semiconductor wafer for producing the semiconductor device. Those applicable include, for example, a glass substrate for the display device, a ceramic wafer for the thin film magnetic head, and a master plate (synthetic silica glass, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus based on the system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved. In the embodiment described above, the light-transmissive type mask (reticle) is used, in which the predetermined light-shielding pattern (or phase pattern or dimming or light-reducing pattern) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be subjected to the exposure. The present invention is also applicable to the exposure apparatus (lithography system) in which a line-and-space pattern is formed on a wafer W by forming interference fringes on the wafer W as disclosed in the pamphlet of International Publication No. 2001/035168.

The invention is also applicable to an exposure apparatus in which the measuring stage ST2 is omitted and only the substrate stage ST1 for holding the substrate P is provided. In this case, the predetermined area 100 formed so as not to pollute the liquid LQ may be provided on the substrate stage ST1, or the above-described dummy substrate DP may be held on the substrate stage ST1 to be used as the predetermined area. In each of the embodiments described above, although the exposure apparatus including the projection optical system PL is described as an example, the invention is also applicable to an exposure apparatus and an exposure method which do not use the projection optical system PL. Even when the projection optical system PL is not used, a substrate is irradiated with the exposure light beam via an optical member such as a lens, and a liquid immersion area is formed in a predetermined space between this optical member and the substrate.

The present invention is also applicable to a twin-stage type exposure apparatus. In the twin-stage type exposure apparatus, the predetermined area formed so as not to contaminate the liquid LQ may be formed on the upper surface of at least one of two stages holding substrates. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

The above-described embodiments adopt an exposure apparatus in which the liquid is locally filled between the projection optical system PL and the substrate P. However, the invention is also applicable to a liquid immersion exposure apparatus which performs exposure in a state that an entire surface of a substrate to be exposed is immersed in a liquid as disclosed, for example, in Japanese Patent Application Laid-open No. 6-124873, Japanese Patent Application Laid-open No. 10-303114, and U.S. Pat. No. 5,825,043. The structure and the exposure operation of such an exposure apparatus are described in detail in U.S. Pat. No. 5,825,043, contents of which are incorporated herein by reference within a range of permission of the domestic laws and ordinances of the state designated or selected in this international application.

As for the type of the exposure apparatus EX, the present invention is not limited to the exposure apparatus for the semiconductor device production for exposing a semiconductor device pattern on the substrate P. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage ST1 and/or the mask stage MST, it is allowable to use any one of those of the air floating type based on the use of the air bearing and those of the magnetic floating type based on the use of the Lorentz's force or the reactance force. Each of the stages ST1, ST2 and MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages ST1, ST2 and MST, it is also allowable to use a plane motor in which a magnet unit provided with two-dimensionally arranged magnets and an armature unit provided with two-dimensionally arranged coils are opposed to one another, and each of the stages ST1, ST2 and MST is driven by the electromagnetic force. In this case, any one of the magnet unit and the armature unit may be connected to the stage ST1, ST2 and MST, and the other of the magnet unit and the armature unit may be provided on the side of the movable surface of the stage ST1, ST2 and MST.

The reaction force, which is generated in accordance with the movement of the stages ST1 and ST2, may be mechanically released to the floor (ground) by using a frame member so that the reaction force is not transmitted to the projection optical system PL, as described in Japanese Patent Application Laid-open No. 8-166475 (U.S. Pat. No. 5,528,118). The contents of U.S. Pat. No. 5,528,118 are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL as disclosed in Japanese Patent Application Laid-open No. 8-330224 (U.S. Pat. No. 5,874,820). The contents of U.S. Pat. No. 5,874,820 are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 13:
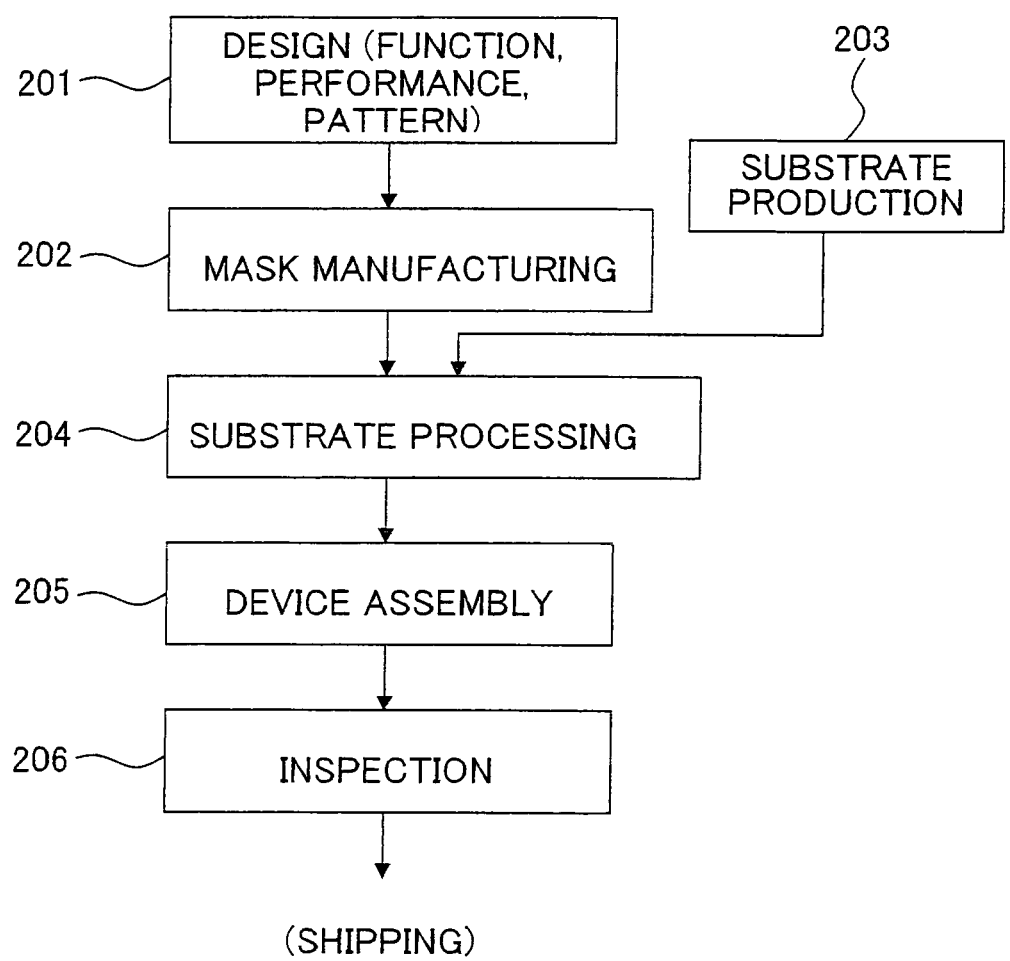
FIG. 13 is a flowchart showing an example of a semiconductor device producing process.

As shown in FIG. 13, a microdevice such as a semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing (exposure process) step 204 of exposing a pattern of the mask on the substrate by using the exposure apparatus EX of the embodiment described above, a step 205 of assembling the device (including a dicing step, a bonding step, and a packaging step), and an inspection step 206, and the like. The substrate-processing step 204 includes the processing described in relation to the drawings such as FIG. 6 and the like.

The invention claimed is:

1. A method for liquid immersion exposure, the method comprising:
   exposing a substrate within an exposure apparatus by projecting a beam onto the substrate through an immersion liquid formed on the substrate; and
   measuring a property, a component, or both of the immersion liquid of the liquid immersion area formed on a surface of a sensor during a non-exposure operation.

2. The method according to claim 1, further comprising collecting the immersion liquid on the surface of the sensor, wherein the measuring includes measuring the property, the component, or the both of the collected immersion liquid.

3. The method according to claim 1, further comprising:
   filling with the immersion liquid an optical path space on the substrate or the surface of the sensor where the optical path space is between the exposure apparatus and the substrate or surface of the sensor.

4. The method of claim 3, further comprising:
   disposing the immersion liquid in the optical path space in a predetermined area so as not to pollute the liquid.

5. The method of claim 1, further comprising recovering the immersion liquid.

6. The method of claim 5, further comprising measuring a property, a component, or both of the recovered immersion liquid.

7. The method of claim 1, further comprising:
   moving at least one of the substrate and the sensor toward each other; and
   moving the immersion liquid between the substrate and the surface of the sensor.

8. The method of claim 1, further comprising:
   controlling the exposing of the substrate based on the measured property, the measured component, or both.

9. The method of claim 1, further comprising determining whether the measured property, the measured component, or both is abnormal, and controlling the exposing of the substrate based on the determination.

10. The method of claim 1, controlling the exposing of the substrate based on whether at least one of the measured property and measured component meets a permissible value.

11. The method of claim 1, further comprising:
    reporting a result of the measuring, and issuing a warning if the result of the measuring is abnormal.

12. The method of claim 1, further comprising:
adjusting at least one of the property or component of the immersion liquid.

13. The method of claim 1, further comprising:
obtaining information of the substrate based on the measured property, the measured component, or both, wherein the information of the substrate includes information of an eluted substance eluted from the substrate.

14. The method of claim 13, further comprising:
determining a permissible value based on the information of the eluted substance eluted from the substrate; and
controlling the exposure of the substrate based on whether at least one of the measured property and measured component meets the permissible value.

15. The method of claim 13, wherein the information of the substrate includes information of a photosensitive material.

16. The method of claim 1, further comprising:
supplying the immersion liquid via a supply channel;
recovering the immersion liquid via a recovery channel; and
obtaining a state of flow based on measuring a property, a component, or both of the immersion liquid in both the supply channel and the recovery channel.

17. The method of claim 16, further comprising:
determining if maintenance of a flow channel between the supply channel and the recovery channel is to be performed based on the obtained state of flow.

18. The method of claim 1, further comprising:
storing the measured property, component, or both in a memory.

19. The method of claim 18, further comprising:
associating the result of the measuring with an elapsed time.

20. The method of claim 18, further comprising:
successively exposing a plurality of substrates;
measuring a property, a component, or both of an immersion liquid of each of the plurality of substrates; and
storing the measured property, component, or both of each of the plurality of substrates in the memory.

21. The method of claim 1, further comprising:
determining a condition of a nozzle, the nozzle being located between the supply channel and the recovery channel.

22. The method of claim 21, wherein the condition of the nozzle is based on if the nozzle needs cleaning or not.

23. The method of claim 21, wherein the condition of the nozzle is based on if the nozzle has a polluted condition or not.

* * * * *

UNITED STATES PATENT AND TRADEMARK OFFICE
CERTIFICATE OF CORRECTION

| | |
|---|---|
| PATENT NO. | : 8,913,224 B2 |
| APPLICATION NO. | : 13/137692 |
| DATED | : December 16, 2014 |
| INVENTOR(S) | : Yoshiki Kida |

It is certified that error appears in the above-identified patent and that said Letters Patent is hereby corrected as shown below:

On the Title Page:

For the Assignee (73), delete "Nixon Corporation" and insert --Nikon Corporation--, therefor.

Signed and Sealed this
Seventh Day of April, 2015

Michelle K. Lee
*Director of the United States Patent and Trademark Office*